(12) United States Patent
Suematsu et al.

(10) Patent No.: US 9,306,186 B2
(45) Date of Patent: Apr. 5, 2016

(54) ORGANIC ELECTRONIC DEVICE AND METHOD OF MANUFACTURING THE SAME

(75) Inventors: Takatoshi Suematsu, Tokyo (JP); Hirokazu Koyama, Tokyo (JP)

(73) Assignee: KONICA MINOLTA, INC., Tokyo (JP)

( * ) Notice: Subject to any disclaimer, the term of this patent is extended or adjusted under 35 U.S.C. 154(b) by 690 days.

(21) Appl. No.: 13/503,579

(22) PCT Filed: Mar. 16, 2011

(86) PCT No.: PCT/JP2011/056151
§ 371 (c)(1),
(2), (4) Date: Apr. 23, 2012

(87) PCT Pub. No.: WO2011/115147
PCT Pub. Date: Sep. 22, 2011

(65) Prior Publication Data
US 2012/0205643 A1 Aug. 16, 2012

(30) Foreign Application Priority Data
Mar. 17, 2010 (JP) ................................. 2010-060549

(51) Int. Cl.
| | | |
|---|---|---|
| H01L 51/54 | (2006.01) | |
| H01L 51/52 | (2006.01) | |
| H01L 51/50 | (2006.01) | |
| H01L 51/00 | (2006.01) | |

(52) U.S. Cl.
CPC .......... *H01L 51/5215* (2013.01); *H01L 51/004* (2013.01); *H01L 51/5088* (2013.01); *H01L 51/0037* (2013.01); *H01L 51/0072* (2013.01); *H01L 51/0073* (2013.01); *H01L 51/0085* (2013.01)

(58) Field of Classification Search
None
See application file for complete search history.

(56) References Cited

U.S. PATENT DOCUMENTS

| | | | | |
|---|---|---|---|---|
| 5,965,281 | A * | 10/1999 | Cao ................................ | 428/690 |
| 6,649,327 | B2 * | 11/2003 | Kim et al. ...................... | 430/313 |
| 6,890,584 | B2 * | 5/2005 | Leenders et al. ................ | 427/58 |
| 2002/0022191 | A1 * | 2/2002 | Lamotte et al. ............... | 430/160 |
| 2005/0129979 | A1 * | 6/2005 | Kambe et al. ................. | 428/690 |
| 2005/0158523 | A1 * | 7/2005 | Gupta et al. ............... | 428/195.1 |
| 2005/0227081 | A1 * | 10/2005 | Hsu et al. .................. | 428/411.1 |

FOREIGN PATENT DOCUMENTS

| | | |
|---|---|---|
| CN | 101023138 | 8/2007 |
| JP | 06-273964 | 9/1994 |
| JP | 2003-045665 | 2/2003 |
| JP | 2004-504693 | 2/2004 |
| JP | 2006-143922 | 6/2006 |
| JP | 2006-286237 | 10/2006 |
| JP | 2007-042314 | 2/2007 |
| JP | 2007214517 A * | 8/2007 |
| JP | 2007-529896 | 10/2007 |
| JP | 2008-115383 | 5/2008 |
| JP | 2008-533701 | 8/2008 |
| JP | 2009-540504 | 11/2009 |
| JP | 2010-021422 | 1/2010 |
| TW | 2008-49692 | 12/2008 |
| WO | 2007-145975 | 12/2007 |

OTHER PUBLICATIONS

Machine translation of JP2006-286237. Date of publication: Oct. 19, 2006.*
Machine translation of JP2007-214517. Date of publication: Aug. 23, 2007.*
Chinese Office Action, Application No. 201180004303.5, Mailing Date: Mar. 14, 2014 (8 pages).
English translation of Chinese Office Action, Application No. 201180004303.5, Mailing Date: Mar. 14, 2014 (12 pages).
The extended European Search Report dated Sep. 23, 2015 issued from the corresponding European Patent Application No. 117563312.

\* cited by examiner

*Primary Examiner* — Andrew K Bohaty
(74) *Attorney, Agent, or Firm* — Lucas & Mercanti, LLP

(57) ABSTRACT

Provided is an organic electronic device exhibiting excellent conductivity and transparency of an electrode, and low driving voltage, together with en excellent storing property and excellent lifetime. Also disclosed is an organic electronic device possessing a transparent substrate and provided thereon, a first transparent electrode, a second electrode and an organic functional layer provided between the first transparent electrode and the second electrode, wherein the first transparent electrode and the second electrode are opposed to each other, and a transparent conductive layer containing a conductive polymer and an aqueous binder is provided between the first transparent electrode and the organic functional layer.

10 Claims, No Drawings

ORGANIC ELECTRONIC DEVICE AND METHOD OF MANUFACTURING THE SAME

CROSS REFERENCE TO RELATED APPLICATION

This Application is a 371 of PCT/JP2011/056151 filed on Mar. 16, 2011 which, in turn, claimed the priority of Japanese Patent Application No. 2010-060549 filed on Mar. 17, 2010, both applications are incorporated by reference herein.

TECHNICAL FIELD

The present invention relates to an organic electronic device exhibiting excellent transparency and low driving voltage, together with an excellent storing property and excellent lifetime.

BACKGROUND

In recent years, attention has been focused on organic electronic devices such as an organic EL device and an organic solar cell. Conventionally, an ITO electrode in which indium-tin composite oxide (ITO) is film-formed on a transparent substrate such as a glass plate, a plastic film or the like via a vacuum evaporation method or a sputtering method has been mainly used as an electrode for an organic electronic device in view of performance such as conductivity and transparency thereof. However, transparent electrodes prepared via vacuum evaporation or sputtering produce inferior productivity as well as high manufacturing cost. Further, there was a problem such that lifetime and a storing property of the device are degraded via damage to an organic functional layer through leakage between electrodes of the device, caused by protrusions on an ITO electrode and adhesion of foreign matter to the ITO electrode. Specifically, when preparing a large area organic electronic device, frequency of occurrence thereof is increased, resulting in appearance of a problem In response, proposed is a method by which a transparent electrode is formed via coating or printing employing a coating solution in which a conductive polymer typified by a π conjugated polymer is dissolved or dispersed in a suitable solvent (Patent Document 1). However, since a conductive polymer was further colored in comparison to an ITO electrode, transparency of an electrode thereof largely dropped, there appeared a problem such that lifetime and a storing property of the organic electronic device were degraded.

In response, it is known that a conductive polymer typified by a n conjugated polymer is formed on an ITO electrode as a hole injection material, or a hole transparent material (Patent Document 2). In formation of the conductive polymer, protrusions and foreign mater on the ITO are to be buried to improve surface smoothness. Further, a barrier of injection of holes is lowered by forming a conductive polymer layer on an ITO transparent electrode, leading to driving voltage drop of the organic electronic device (Patent Document 2). Depending on protrusions and foreign matter in size, a conductive polymer layer necessary for burying them becomes thicker, and it is difficult to satisfy transparency of an electrode, and lifetime and a storing property of a device at the same time.

Also known is a method of forming a layer in which a conductive polymer and a non-aqueous binder are used in combination, on an ITO electrode (Patent Document 3). In Patent Document 3, disclosed is a hole injection layer containing an intrinsically conductive polymer, a dopant and a synthetic polymer-planarizing agent in a non-aqueous system. It is described that the film thickness can be thickened while suppressing reduction in transparency. However, in the case of a coating process in which a synthetic polymer and a conductive polymer were used in a non-aqueous system, surface smoothness at the nano-level became inferior when thickening the film thickness, wherein as a result, there appeared a problem such that lifetime and a storing property of the device were degraded via rise of the driving voltage. Further, a non-aqueous solvent was conventionally used when forming an organic functional layer, but there appeared another problem such that the upper layer to be coated was damaged when using a non-aqueous binder, whereby lifetime and a storing property of the device were degraded. Furthermore, since a synthetic polymer in the non-aqueous system conventionally produced no effect to assist conductivity, there was a problem such that just to mix a small amount of it produced large drop in conductivity of the film, and as a result, the film thickness could not be thickened.

PRIOR ART DOCUMENT

Patent Document

Japanese Patent O.P.I. (Open to Public Inspection) Publication No. 6-273964
Japanese Patent O.P.I. Publication No. 2003-45665
Published Japanese translation of PCT international Publication No. 2008-533701

DISCLOSURE OF THE INVENTION

Problems to be Solved by the Invention

The present invention has been made on the basis of the foregoing situation, and it is an object of the present invention to provide an organic electronic device exhibiting excellent conductivity and transparency of an electrode, and low driving voltage, together with an excellent storing property and excellent lifetime.

Means to Solve the Problems

The above-described object of the present invention can be accomplished by the following structures.

(Structure 1) An organic electronic device comprising a transparent substrate and provided thereon, a first transparent electrode, a second electrode and an organic functional layer provided between the first transparent electrode and the second electrode, wherein the first transparent electrode and the second electrode are opposed to each other, and a transparent conductive layer comprising a conductive polymer and an aqueous binder is provided between the first transparent electrode and the organic functional layer.

(Structure 2) The organic electronic device of Structure 1, comprising the transparent conductive layer in which at least a part of the conductive polymer or the aqueous binder is crosslinked.

(Structure 3) The organic electronic device of Structure 1 or 2, wherein the conductive polymer comprises a conductive polymer containing a π conjugated conductive polymer component and a polyanionic component.

(Structure 4) The organic electronic device of Structure 3, wherein the polyanionic component comprises a polysulfonic acid group.

(Structure 5) The organic electronic device of any one of Structures 1-4, wherein the aqueous binder comprises the following Polymer (A):

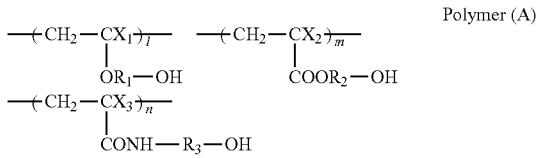

Polymer (A)

where $X_1$, $X_2$ and $X_3$ each independently represent a hydrogen atom or a methyl group; $R_1$, $R_2$ and $R_3$ each independently represent an alkylene group having 5 carbon atoms or less; and "l", "m" and "n" each represent a component ratio of mol/%, satisfying $50 \leq l+m+n \leq 100$.

(Structure 6) The organic electronic device of any one of Structures 1-5, wherein the transparent conductive layer comprises one having been subjected to wet washing.

(Structure 7) The organic electronic device of any one of Structures 1-6, wherein the organic functional layer adjacent to the transparent conductive layer comprises a hole injection layer.

(Structure 8) The organic electronic device of Structure 7, wherein the hole injection layer comprises a polyanion containing fluorine (F).

(Structure 9) A method of manufacturing the organic electronic device of any one of Structures 1-8, comprising the step of conducting a heat treatment at a temperature of 100-250° C. for 5 minutes or more after coating and drying of the transparent conductive layer comprising the conductive polymer and the aqueous binder.

Effect of the Invention

An organic electronic device exhibiting excellent conductivity and transparency of an electrode, and low driving voltage, together with an excellent storing property and excellent lifetime was able to be provided when using a transparent conductive film of the present invention.

DESCRIPTION OF THE PREFERRED EMBODIMENTS

Next, the preferred embodiments to realize the present invention will be described in detail, but the present invention is not limited thereto.

It is required in the present invention that an organic electronic device comprising a transparent substrate and provided thereon, a first transparent electrode, a second electrode and an organic functional layer provided between the first transparent electrode and the second electrode, wherein the first transparent electrode and the second electrode are opposed to each other, and a transparent conductive layer comprising a conductive polymer and an aqueous binder is provided between the first transparent electrode and the organic functional layer. Further, the foregoing transparent conductive layer in which at least a part of the conductive polymer or the aqueous binder is crosslinked is provided between them.

In addition, "crosslinkage" described in the present invention is one to change glass transition temperature and nanoindentation elastic modulus, and further to physically and chemically change a functional group and so forth measured via FTIR, and means formation of a crosslinking structure via covalent bonding, and in addition, for example, means one to physically and chemically change orientation, crystallization associated with the orientation and so forth.

First, a conductive polymer of which a transparent conductive layer is formed, and an aqueous binder will be described.

[Conductive Polymer]

A conductive polymer of the present invention is not specifically limited, but it is preferably a polymer containing a π conjugated conductive polymer and a polyanion. This conductive polymer can be easily prepared by chemical oxidative polymerization of a precursor monomer to form the aftermentioned π conjugated conductive polymer under the presence of a suitable oxidant, an oxidation catalyst and the aftermentioned polyanion.

(π Conjugated Conductive Polymer)

The π conjugated conductive polymer used in the present invention is not specifically limited. The following chain conductive polymers can be used for it: polythiophenes, polypyrroles, polyindoles, polycarbazoles, polyanilines, polyacethylenes, polyfurans, polyparaphenylene vinylelenes, polyazulenes, polyparaphenylenes, polyparaphenylene sulfides, polyisothianaphthenes, and polythiazyls. Of these, polythiophenes and polyanilines are preferable in view of conductivity, transparency, stability and so forth. Polyethylene dioxythiophene is most preferable.

(π Conjugated Conductive Polymer Precursor Monomer)

A π conjugated conductive polymer precursor monomer is a compound having a π conjugated system in the molecule and is one in which a π conjugated system is formed in the main chain of a polymer during polymerization via action of a suitable oxidizant. For example, cited are pyrroles and their derivatives, thiophenes and their derivatives, and anilines and their derivatives.

Examples of the π conjugated conductive polymer precursor monomer include pyrrole, 3-methylpyrrole, 3-ethylpyrrole, 3-n-propylpyrrole, 3-butylpyrrole, 3-octylpyrrole, 3-decylpyrrole, 3-dodecylpyrrole, 3,4-dimethylpyrrole, 3,4-dibutylpyrrole, 3-carboxylpyrrole, 3-methyl-4-carboxyl pyrrole, 3-methyl-carboxyethyl pyrrole, 3-methyl-4-carboxybutylpyrrole, 3-hydroxypyrrole, 3-methoxypyrrole, 3-ethoxypyrrole, 3-butoxypyrrole, 3-hexyloxypyrrole, 3-methyl-4-hexyloxypyrrole, thiophene, 3-methylthiophene, 3-ethylthiophene, 3-propylthiophene, 3-butylthiophene, 3-hexylthiophene, 3-heptylthiophene, 3-octylthiophene, 3-decylthiophene, 3-dodecylthiophene, 3-octadecylthiophene, 3-bromothiophene, 3-chlorothiophene, 3-iodothiophene, 3-cyanothiophene, 3-phenylthiophene, 3,4-dimethylthiophene, 3,4-dibutylthiophene, 3-hydroxythiophene, 3-methoxythiophene, 3-ethoxythiophene, 3-butoxythiophene, 3-hexyloxythiophene, 3-heptyloxythiophene, 3-octyloxy thiophene, 3-decyloxythiophene, 3-dodecyloxythiophene, 3-octadecyloxythiophene, 3,4-dihydroxythiophene and 3,4-dimethoxythiophene, 3,4-diethoxthiophene, 3,4-dipropoxythiophene, 3,4-dibutoxythiophene, 3,4-dihexyloxythiophene, 3,4-diheptyloxythiophene, 3,4-dioctyloxythiophene, 3,4-didecyloxythiophene, 3,4-didodecyloxy thiophene, 3,4-ethylenedioxythiophene, 3,4-propylenedioxythiophene, 3,4-butenedioxythiophene, 3-methyl-4-methoxythiophene, 3-methyl-4-ethoxythiophene, 3-carboxythiophene, 3-methyl-4-carboxythiophene, 3-methyl-4-carboxyethyl thiophene, 3-methyl-4-carboxybutylthiophene, aniline, 2-methylaniline, 3-isobutylaniline, sulfonic acid, 3-aniline sulfonic acid and so forth.

[Polyanion]

Examples of the polyanion of the present invention include a substituted or unsubstituted polyalkylene, substituted or unsubstituted polyalkenylene, substituted or unsubstituted polyimide, substituted or unsubstituted polyamide, substituted or unsubstituted polyester, and a copolymer thereof.

The polyanion is one having an anionic group as a substituent, and may be composed of a constituent unit having an anionic group and a constituent unit having no anionic group.

This polyanion is a functional polymer to solubilize a π conjugated conductive polymer in a solvent. Further, the anionic group of the polyanion functions as a dopant to the π conjugated conductive polymer, and conductivity and heat resistance of then conjugated conductive polymer are improved.

The anionic group of a polyanion may be a functional group possibly producing chemical oxidation dope to the π conjugated conductive polymer, but in view of easy and stable production, preferable are a mono-substituted sulfate group, a mono-substituted phosphate group, a phosphate group, a carboxyl group and a sulfo group. Furthermore, a sulfo group, a mono-substituted sulfate group and a carboxyl group are more preferable in view of a doping effect to the π conjugated conductive polymer of the functional group.

Specific examples of the polyanion include a polyvinyl sulfonic acid, a polystyrene sulfonic acid, a polyallyl sulfonic acid, an ethyl polyacrylate sulfonic acid, a butyl polyacrylate sulfonic acid, a poly-2-acrylamide-2-methylpropane sulfonic acid, a polyisoprene sulfonic acid, a polyvinyl carboxylic acid, a polystyrene carboxylic acid, a polyallyl carboxylic acid, a polyacryl carboxylic acid, a polymethacryl carboxylic acid, a poly-2-acrylamide-2-methylpropane carboxylic acid, a polyisoprene carboxylic acid, a polyactylic acid and so forth. These may be a homopolymer, or may be a copolymer of at least two kinds.

Further, it may be a polyanion containing a fluorine atom in the molecule. Specific examples thereof include NAFION containing perfluorosulfonic acid (produced by DuPont Co., Ltd.) and FLEMION containing perfluoro-based vinyl ether containing a carboxylic acid (produced by Asahi Glass Co., Ltd.).

Among them, the case of a compound containing a sulfonic acid is more preferable, since when a heat treatment is conducted for 5 minutes or more at a temperature of 100-250° C. after conducting coating and drying to form a conductive polymer-containing layer, washing resistance and solvent resistance of this coating film will be largely improved.

Further, of these, polystyrene sulfonic acid, polyisoprene sulfonic acid, ethyl polyacrylate sulfonic acid, and butyl polyacrylate sulfonic acid are preferable. These polyanions have high compatibility with an aqueous binder, and conductivity of the resulting conductive polymer can be made higher.

The polymerization degree of a polyanion is preferably in the range of 10-100,000 monomer units, and more preferably in the range of 50-10,000 monomer units in view of solvent solubility and conductivity.

Examples of a method of manufacturing a polyanion include a method in which an anion group is directly introduced into a polymer containing no anionic group, employing an acid; a method in which a polymer containing no anionic group is sulfonation-oxidized with a sulfonation agent; a method of preparation via polymerization of an anionic group-containing polymerizable monomer, and so forth.

A method in which polymerization is carried out using a polymerizable monomer containing an anionic group is as follows. A polymerizable monomer containing an anion group is subjected to an oxidative polymerization or a radical polymerization under the presence of an oxidant and/or a polymerization catalyst in a solvent. Specifically, a predetermined amount of a polymerizable monomer containing an anionic group is dissolved in a solvent, and the mixture is kept at a constant temperature. To the mixture, added is a solution which has dissolved a predetermined amount of an oxidant and/or a polymerization catalyst in a solvent beforehand. The mixture is made to react within the predetermined time. The polymer obtained by this reaction is adjusted to a fixed concentration by the solvent. In this manufacturing method, it is possible to carry out copolymerization of a polymerizable monomer containing no anionic group with a polymerizable monomer containing an anionic group.

An oxidant, an oxidation catalyst and a solvent used for polymerization of a polymerizable monomer containing an anionic group are the same as those when a precursor monomer to form a π conjugated conductive polymer is polymerized.

When the resulting polymer is a polyanion salt, it is preferable to modify it to a polyanionic acid. Examples of the method of modification into a polyanionic acid include an ion-exchange method employing an ion-exchange resin, a dialysis method, an ultrafiltration method and so forth. Of these, the ultrafiltration method is preferable in view of easy operation.

Commercially available polymers are also preferably usable.

For example, conductive polymers made from poly (3,4-ethylenedioxythiophene) and polystyrene sulfonic acid (abbreviated as PEDOT-PSS) are available as Clevios series produced by H. C. Starck Co., Ltd., as PEDOT-PSS 483095 and PEDOT-PSS 560596 produced by Aldrich Co., Ltd., and as Denatron series produced by Nagase Chemtex Co., Ltd. Further, polyanion is commercially available as ORMECON series produced by Nissan Chemical Industries, Ltd. These compounds are also preferably usable in the present invention.

When the foregoing polyanion is used as the first dopant for each of these conductive polymers, a water-soluble organic compound may be also contained as the second dopant. The water-soluble organic compound usable in the present invention is not specifically limited, and it can be selected from commonly known compounds. The oxygen atom-containing organic compound is not specifically limited as long as it contains an oxygen atom in the molecule. Examples thereof include a hydroxyl group-containing compound, a carbonyl group-containing compound, an ether group-containing compound, a sulfoxide group-containing compound and so forth. Examples of the foregoing hydroxyl group-containing compound include ethylene glycol, diethylene glycol, propylene glycol, trimethylene glycol, 1,4-butanediol, glycerin and so forth. Of these, ethylene glycol and diethylene glycol are preferable. Examples of the foregoing carbonyl group-containing compound include isophorone, propylene carbonate, cyclohexanone, γ-butyrolactone, and so forth. Examples of the foregoing ether group-containing compound include diethylene glycol monoethyl ether and so forth. Examples of the foregoing sulfoxide group-containing compound include dimethyl sulfoxide and so forth. These may be used singly, or in combination with at least two kinds thereof but preferable is at least one selected from the group consisting of dimethyl sulfoxide, ethylene glycol and diethylene glycol.

[Aqueous Binder]

An aqueous binder of the present invention forms a transparent conductive layer with a conductive polymer. At least a part of the transparent conductive layer relating to the present invention is crosslinked. In the present invention, "a part of the transparent conductive layer relating to the present invention is crosslinked" indicates a case where a part of the aqueous binder takes a crosslinking structure, and another case where a crosslinking structure is taken between the aqueous binder and the conductive polymer.

As to the present invention, the effect of the present invention is achieved with respect to any of the both cases, or the both cases in combination. In this case, migration of a very small impurity in the transparent conductive layer is restricted, diffusion of the impurity in the layer is suppressed. Further, The details of the mechanism are unknown, but even though film thickness is made thicker, the surface smoothness of a transparent conductive layer made of a conductive polymer and an aqueous binder in the present invention is not deteriorated like a non aqueous binder, so that lifetime and stability of an organic electronic device are improved.

Further, various resins are usable for the aqueous binder, provided that a hydrophilic group is contained therein, and examples thereof include a polyester resin, an acrylic resin, a polyurethane resin, an acrylic urethane resin, a polycarbonate resin, a cellulose resin and a polyvinyl acetal based resin. These can be used singly, or in combination with at least two kinds thereof. The hydrophilic groups are not limited to the following, but a hydrophilic group such as a hydroxyl group, a carboxyl group, an amide group, or the like may be contained.

Since at least a part of the aqueous binder is crosslinked with a conductive polymer or an aqueous binder itself, a crosslinking agent may be contained in the aqueous binder. The crosslinking agent is not specifically limited as long as it is compatible with a resin and forms crosslinkage. Usable examples of the crosslinking agent include an oxazoline based crosslinking agent, a carbodiimide based crosslinking agent, a block-isocyanate based crosslinking agent, an epoxy based crosslinking agent, a melamine based crosslinking agent, a formaldehyde based crosslinking agent and so forth. These can be used singly or in combination with at least two kinds thereof.

Specifically, when the anionic component in the conductive polymer comprises a polysulfonic acid group, and the hydrophilic group of the above-described aqueous binder has a hydroxyl group, the anion component of the conductive polymer and the hydrophilic group of the aqueous binder are safely crosslinked, whereby longer lifetime of an organic electronic device is preferably obtained because of suppression of dissociation thereof. Further, when the anionic component in the conductive polymer comprises a sulfonic acid group, the foregoing polymer (A) is used as an aqueous binder, polymer (A) has an effect to assist conductivity, and conductivity and transparency of a transparent conductive layer are not deteriorated. Further, in the present invention, it would appear that crosslinkage is formed when a part of a hydrophilic group contained in an aqueous binder is dehydration-condensed. Therefore, the cross linkage can be measured by variation of the glass transition temperature and change of a nanoindentation elastic modulus of the transparent conductive layer, or further, change of a functional group measured via FTIR measurement. Furthermore, when the sulfonic acid group exists, the sulfonic acid group and the hydrophilic group in the aqueous binder are stably bonded to each other, whereby dissociation of the sulfonic acid group can be suppressed. For this reason, this is more preferable to extend lifetime of an organic electronic device.

[Polymer (A)]

In the present invention, the aqueous binder is preferably represented by the foregoing polymer (A).

As to polymer (A), a main copolymer component is a monomer represented by each of the following monomers 1-3, and 50 mol % or more of copolymer components are occupied for any of the following monomers 1-3, or polymer (A) is preferably a copolymer in which the following monomers 1-3 have a total component amount of 50 mol % or more.

The following monomers 1-3 preferably have a total component amount of 80 mol % or more. Further, polymer (A) may be a homopolymer formed from any single one of the following monomers 1-3. This is also one of the preferred embodiments.

     Monomer 1

     Monomer 2

     Monomer 3 where, $X_1$, $X_2$, $X_3$, $R_1$, $R_2$ and $R_3$ each represent the same groups represented by $X_1$, $X_2$, $X_3$, $R_1$, $R_2$ and $R_3$ of the foregoing polymer (A).

In polymer (A), other monomer components may be copolymerized, but it is more preferably a high hydrophilic monomer component.

Further, it is preferable that polymer (A) contains a component having a number average molecular weight of 1,000 in a content amount of 0 to 5% or less. In the case of a small amount of a low molecular component, a behavior where there are likely to be a barrier in the direction perpendicular to a layer when exchanging charge in the direction perpendicular to a conductive layer, and a storing property of a device can be further lowered.

As to polymer (A), as a method of making a content of a number average molecular weight of 1000 or less to fall within the range of 0-5%, usable are a method of eliminating a low molecular weight component by a reprecipitation method or a sorting GPC, and a method of suppressing production of a low molecular weight component by synthesizing a monodispersed polymer via living polymerization. The reprecipitation method is a method by which a polymer is dissolved in a soluble solvent, and the polymer is precipitated by dripping the polymer into a solvent exhibiting lower dissolution than that of a solvent in which the polymer is dissolved to eliminate a low molecular component of a monomer, a catalyst, an oligomer or the like. Further, the sorting GPC is a method by which a solution in which a polymer is dissolved can be divided into those of different molecular weights by introducing it into a column employing for example, a recycle sorting GPC LC-9100 (manufactured by Japan Analytical Industry, Co., Ltd.) and a polystyrene column, and a desired one of low molecular weight can be cut. In the living polymerization, production of an initiator remains unchanged during aging, and there is less side reaction such as termination reaction or the like, whereby a polymer in which molecular weight is uniformly arranged can be obtained. Since the molecular weight can be adjusted by an addition amount of a monomer, preparation of a low molecular weight component can be inhibited by for example, synthesizing a polymer having a molecular weight of 20000. The reprecipitation method and the living polymerization method are preferable in view of manufacturing suitability.

The measurement of the number average molecular weight and the weight average molecular weight of an aqueous binder in the present invention can be done by commonly known gel permeation chromatography (GPC). The molecular weight distribution can be represented by a ratio of (weight average molecular weight/number average molecular weight). There is no restriction in particular to a solvent to be used as long as an aqueous binder is dissolved. THF, DMF and $CH_2Cl_2$ are preferable; THF and DMF are more preferable; and DMF is still more preferable. Further, there is no restriction in particular to a measurement temperature, but 40° C. is preferable.

Polymer (A) desirably used in the present invention preferably has a number average molecular weight of 3,000-2,000,000; more preferably has a number average molecular weight of 4,000-500,000; and most preferably has a number average molecular weight of 5,000-100,000.

Polymer (A) preferably has a molecular weight distribution of 1.01-1.30, and more preferably has a molecular weight distribution of 1.01-125.

As to a content of a number average molecular weight of 1,000 or less, a ratio was converted by integrating the area of a number average molecular weight of 1,000 or less in the distribution obtained by GPC, and dividing it by the area of the entire distribution.

The living radical polymerization solvent is inactive under the reaction condition, and it is not specifically limited as long as it is a monomer and a polymer to be prepared can be dissolved, but a solvent in which an alcohol based solvent is mixed with water is preferable. Temperature of the living radical polymerization depends on initiators to be used, but conventionally, the temperature is −10° C. to 250° C.; preferably 0° C. to 200° C.; and more preferably 10° C. to 100° C.

As to a ratio of a conductive polymer to an aqueous binder, specifically, a ratio when polymer (A) is used as an aqueous binder, 30 parts by weigh to 900 parts by weight of polymer (A) are preferable when a conductive polymer is set to 100 parts by weight, and 100 parts by weight or more of polymer (A) are more preferable in view of prevention of leakage, conductivity-assisting effect of polymer (A) and transparency.

[Transparent Conductive Layer]

In the case of the present invention, since a transparent conductive layer is present between the first transparent electrode and an organic functional layer, protrusions and foreign matter can be embedded in the transparent conductive layer, and damage to the organic functional layer such as leakage between electrodes in a device is relieved, whereby a storing property and lifetime of the device are improved. Further, when forming a transparent conductive layer, it would appear that a conductive polymer having lower surface energy than that of an aqueous binder is oriented on the surface, and an injection barrier of holes at the interface between the conductive layer and the organic functional layer is lowered, whereby driving voltage of the device drops.

In the present invention, as a method of forming a transparent conductive layer, it is preferred that a mixed solution made from at least a conductive polymer and an aqueous binder is coated on the first transparent electrode, and followed by drying to form the transparent conductive layer. Further, a solid content in the coating solution is preferably 0.5-30% by weight, and more preferably 1-20% by weight in view of standing stability of the solution, smoothness of the coated film, and generation of the leakage-prevention effect.

Usable examples of coating methods include a roll coating method, a bar coating method, a dip coating method, a spin coating method, a casting method, a die coating method, a blade coating method, a gravure coating method, a curtain coating method, a spray coating method, and a doctor coating method, a letterpress (typographic) printing method, a porous (screen) printing method, a planographic (offset) printing method, an intaglio (gravure) printing, a spray printing method, an ink-jet printing method and so forth.

The transparent conductive layer preferably has a dry film thickness of 30-2000 nm. Since conductivity becomes large when the conductive layer of the present invention has a dry film thickness of not less than 100 nm, a dry film thickness of not less than 100 nm is more preferable, and a dry film thickness of not less than 200 nm is still more preferable in view of further enhanced leakage-prevention effect. Further, a dry film thickness of not more than 1000 nm is also more preferable in order to maintain high transparency.

A drying treatment is appropriately carried out after coating. The condition of the drying treatment is not specifically limited, but the drying treatment is preferably conducted at temperature in the temperature range where a substrate and a conductive polymer-containing layer are not damaged. For example, the drying treatment can be conducted at a temperature of 80° C. to 150° C. for a duration of 10 seconds to 30 minutes.

Specifically, when the polyanion is a polyanion containing a sulfonic acid group, it is preferable to conduct a additional heat-treatment at a temperature of 100-250° C. for at least 5 minutes after forming a layer via coating, followed by drying. By doing this, cleaning resistance and solvent resistance of a transparent conductive layer are largely improved. Further, a storing property is also improved. At less than 100° C., this effect is small, and when the substrate is formed of a resin film, also at a temperature exceeding 200° C., this effect is reduced because of possibly increasing of another reaction. However, when using a heat-resistant support made of glass or the like, it was found out that preferable performance was obtained at about 250° C. When the substrate is formed of a resin film, a treatment temperature of 110-160° C. is preferable, and a treatment duration of 15 minutes or more is preferable. There is specifically no upper limit of the treatment duration, but a treatment duration of 120 minutes or less is preferable in view of manufacturing efficiency.

A surface treatment may be conducted for the transparent conductive layer in view of wettability, and a commonly known technique is usable for the surface treatment. Examples of the surface treatment include surface activation treatments such as a corona discharge treatment, a flame treatment, a UV treatment, a high-frequency wave treatment, a glow discharge treatment, an active plasma treatment, a laser treatment and so forth.

Next, an organic electronic device possessing a transparent conductive layer of the present invention will be described.

[Organic Electronic Device]

An organic electronic device of the present invention possesses a substrate and provided thereon, a first transparent electrode, a second electrode, and at least one organic functional layer provided between the first transparent electrode and the second electrode, wherein the first transparent electrode and the second electrode are opposed to each other. The organic functional layer is not specifically limited, and examples of the organic functional layer include an organic emission layer, an organic photoelectric conversion layer, a liquid crystal polymer layer and so forth, but the present invention is specifically effective when the organic functional layer is a thin film, and is an organic emission layer or an organic photoelectric conversion layer as a device of a current-driving system.

[Organic Functional Layer]

In the present invention, in addition to an organic emission layer and an organic photoelectric conversion layer, an organic functional layer in the present invention may possess luminescence-controlling layers such as a hole injection layer, a hole transport layer, an electron transport layer, an electron injection layer, a hole blocking layer, an electron blocking layer and so forth in combination with the organic emission layer. In the present invention, a transparent conductive layer containing a conductive polymer is possible to serve as a hole injection layer, but it is preferable in view of easy-to-move of holes that a hole injection layer is independently provided, and the hole injection layer is adjacent to the transparent conductive layer.

[Organic Electroluminescence Device]

First, an organic electroluminescence (hereinafter, abbreviated as EL) device in which an organic functional layer is an organic emission layer will be described. Structural examples each in which an organic functional layer is an emission layer are shown below. The present invention is not limited thereto, but a device having structure (v) is specifically preferable as described above.

(i) (the first transparent electrode)/(transparent conductive layer)/emission layer/electron transport layer/(the second electrode section)

(ii) (the first transparent electrode)/(transparent conductive layer)/hole transport layer/emission layer/electron transport layer/(the second electrode section)

(iii) (the first transparent electrode)/(transparent conductive layer)/hole transport layer/emission layer/hole blocking layer/electron transport layer/(the second electrode section)

(iv) (the first transparent electrode)/(transparent conductive layer)/hole transport layer/emission layer/hole blocking layer/electron transport layer/electron injection layer/(the second electrode section)

(v) (the first transparent electrode)/(transparent conductive layer)/hole injection layer/hole transport layer/emission layer/hole blocking layer/electron transport layer/electron injection layer/(the second electrode section)

[Emission Layer]

The emission layer may be a monochromatic emission layer exhibiting an emission maximum wavelength in the range of 430-480 nm, 510-550 nm, or 600-640 nm, and may also be one in which at least these 3 emission layers are laminated to prepare a white emission layer, and further, a nonluminescent intermediate layer may also be provided between emission layers. The organic EL device relating to the present invention preferably possesses the white emission layer.

Further, examples of the light-emitting material usable for an organic emission layer in the present invention include anthracene, naphthalene, pyrene, tetracene, coronene, paylene, phthaloperylene, naphthalopertlene, diphenyl butadiene, tetraphenylbulndiene, coumarin, oxadiazole, bisbenzoxazoline, bisstyryl, cyclopentadiene, a quinoline metal complex, a tris (8-hydroxyquinolinate) aluminum complex, a tris (4-methyl-8-quinolinate) aluminum complex, a tris (5-phenyl-8-quinolinate) aluminum complex, an aminoquinoline metal complex, a benzoquinoline metal complex, a tri-(p-terphenyl-4-yl) amine, a 1-aryl-2,5-di(2-thienyl)pyrole derivative, pyran, quinacridone, rubrene, a distyrylbenzene derivative, a distyrylarylene derivative; and various fluorescent dyes, rare earth metal complexes and phosphorescent light-emitting materials, but the present invention is not limited thereto. It is also preferable to be designed to make the light-emitting material selected from these compounds to have a content of 90-99.5 parts by weight, and to make the doping material to have a content of 0.5-10 parts by weight. The organic emission layer is prepared by a commonly known employing the above-described material and so forth, and examples of the method include an evaporation method, a coating method, a transferring method and so forth. This organic emission layer preferably has a thickness of 0.5-500 nm, and more preferably has a thickness of 0.5-200 nm.

[Injection Layer: Electron Injection Layer and Hole Injection Layer]

An injection layer is referred to as a layer provided between an electrode and an organic functional layer to lower a driving voltage and to improve emission luminance, which is detailed in "Electrode Material" in volume 2, chapter 2 (pages 123-166) of "Organic EL Element and its Industrialization Front (published by N. T. S Corp. on Nov. 30, 1998)", and a hole injection layer and an electron injection layer are included. It is desired for the hole injection layer that difference in work function in comparison to the first transparent electrode is small. These are described in detail in Japanese Patent O.P.I. Publication No. 9-45479, Japanese Patent O.P.I. Publication No. 9-260062 and Japanese Patent O.P.I. Publication No. 8-288069, and specific examples thereof include a phthalocyanine buffer layer typified by copper phthalocyanine, an oxide buffer typified by vanadium oxide, an amorphous carbon buffer layer, a conductive polymer layer made of polyaniline (emeraldine), polythiophene or the like, and so forth. Specifically, a conductive polymer layer is preferably used since it is possible to be used with a coating method. The conductive polymer of which a hole injection layer is made preferably comprises a polyanion containing fluorine (F) in the compound in view of a work function. Further, F may be added afterward, ant it may be a perfluorinated polyanion. Specific examples thereof include Nafion containing a perfluoro based sulfonic acid (produced by DuPont Co, Ltd.), Flemion formed of perfluoro based vinyl ether containing a carboxylic acid (produced by Asahi Glass Co., Ltd.), and so forth.

The electron injection layer is detailed in Japanese Patent O.P.I Publication No. 6-325871, Japanese Patent O.P.I. Publication No. 9-17574 and Japanese Patent O.P.I. Publication No. 10-74586, and specific examples thereof include a metal buffer layer typified by strontium, aluminum or the like, an alkali metal compound buffer layer typified by lithium fluoride, an alkali earth metal compound buffer layer typified by magnesium fluoride, an oxide buffer layer typified by aluminum oxide, and so forth. The injection layer is preferably a very thin film, and preferably has a thickness of 0.1 nm to 5 μm, depending on the material to be used. Further, when using a conductive polymer, the thickness is more preferably in the range of 5-50 nm in view of transparency.

[Blocking Layer. Hole Blocking Layer and Electron Blocking Layer]

A blocking layer is one provided in addition to basic structural layers for an organic compound thin film, if desired. For example, there is the hole blocking layer described in Japanese Patent O.P.I. Publication No. 11-204258; Japanese Patent O.P.I. Publication No. 11-204359; page 237 of "Organic EL Element and its Industrialization Front (published by N. T. S Corp. on Nov. 30, 1998)", and so forth. A hole blocking layer has a function of an electron transport layer in a broad sense, and is made of a material exhibiting extremely small capability to transport holes while having a function to transport electrons, whereby a recombination probability of electrons and holes can be improved by inhibiting holes while transporting electrons. Further, the structure of the after-mentioned electron transport layer is usable as a hole blocking layer, if desired. The hole blocking layer provided in a white organic EL device of the present invention is preferably provided adjacent to an emission layer. On the other hand, an electron blocking layer has a function of a hole transport layer in a broad sense, and is made of a material exhibiting extremely small capability to transport electrons while having a function to transport holes, whereby a recombination probability of electrons and holes can be improved by inhibiting electrons while transporting holes. Further, the structure of the after-mentioned hole transport layer is usable as an electron blocking layer, if desired. Each of the hole blocking layer and the electron blocking layer relating to the <Hole Transport Layer>

A hole transport layer is formed of a hole transport material to transport holes, and in a broad sense, a hole injection layer and an electron blocking layer are also included in the hole transport layer. A single layer or plural layers may be provided as a hole transport layer. The hole transport material exhibits injection or transport of holes, or an electron bather property, and may be any of an organic substance or an inorganic substance. Examples thereof include a triazole derivative, an oxadiazole derivative, an imidazole derivative, a polyarylalkane derivative, a pyrazoline or pyrazolone derivative, a phenylenediamine derivative, an arylamine derivative, an amino-substituted chalcone derivative, an oxazole derivatives, a styrylanthracene derivative, a fluorenone derivative, a hydrazone derivative, a stilbene derivative, a silazane derivative, an aniline based copolymer, a conductive polymeric oligomer, specifically thiophene oligomer and so forth. Those described above can be used as a hole transport material, but it is preferable to further use a porphyrin compound, an aromatic tertiary amine compound and a styrylamine compound, and an aromatic tertiary amine compound is specifically preferable. Typical examples of the aromatic tertiary amine compound and the styrylamine compound include N, N,N',N'-tetraphenyl-4,4'-diaminophenyl; N,N'-diphenyl-N,N'-bis(3-methylphenyl)-(1,1'-biphenyl)-4,4'-diamine (TDP); 2,2-bis(4-di-p-tolylaminophenyl) propane; 1,1-bis(4-di-p-tolylaminophenyl)cyclohexane; N,N,N',N'-tetra-p-tolyl 4,4'-diaminobiphenyl; 1,1-bis(4-di-p-tolylaminophenyl)-4-phenylcyclohexane; bis(4-dimethylamino-2-methyl)phenylmethane; bis(4-di-p-tolylaminophenyl)phenylmethane; N,N'-diphenyl-N,N'-di(4-methoxyphenyl)-4,4'-diaminobiphenyl; N,N,N',N'-tetraphenyl-4,4'-diaminophenylether, 4,4'-bis(diphenylamino) quadriphenyl; N,N,N-tri (p-tolyl) amine; 4-(di-p-tolylamino)-4'-[4-(di-p-triamino) styryl]stilbene; 4-N,N-diphenylamino-(2-diphenylvinyl)benzene; 3-methoxy-4'-N,N-diphenylaminostilbenzene; and N-phenylcarbazole, in addition to one having two condensed aromatic rings in the molecule, described in U.S. Pat. No. 5,061,569, which is, for example, 4,4'-bis[N-(1-naphthyl)-N-phenylamino]biphenyl (NPD), and 4,4',4''-tris[N-(3-methylphenyl)-N-phenylamino]triphenylamine (MTDATA) described in Japanese Patent Publication No. 4-308688 in which three triphenylamine units are bonded in the form of a star burst type, and so forth. Further, the polymeric material in which these substances are introduced in a polymer chain, or used for a main chain is also usable. Further, inorganic compounds such as a p type-Si, a p type-SiC and so forth are usable as a hole injection material and hole transport material. Also usable are hole transport materials each appearing to exhibit a so-called p type semiconductor property as described in Japanese Patent O.P.I. Publication No. 4-297076, Japanese Patent O.P.I. Publication No. 2000-196140, Japanese Patent O.P.I. Publication No. 2001-102175, J. Appl. Phys., 95, 5773 (2004), Japanese Patent O.P.I. Publication No. 11-251067, J. Huang et al. p. 139, Applied Physics Letters 80 (2002), and Published Japanese translation of PCT international Publication No. 2003-519432. Since higher efficiency light-emitting device can be obtained in the present invention, these materials are preferably usable. The hole transport layer can be formed via preparation of a thin layer formed of a hole transport material by a commonly known method such as a vacuum evaporation method, a spin coating method, a cast method, an ink-jet method, a LB method or the like. The film thickness of the hole transport layer is not specifically limited, but the hole transport layer generally has an approximate thickness of 5 nm to 5 µm, and preferably has a thickness of 5-200 nm. This hole transport layer may have a single layer structure in which one kind of material described above is contained, or at least two kinds of materials described above are contained <Electron Transport Layer>

An electron transport layer is formed of a material exhibiting a function to transport electrons, and in a broad sense, an electron injection layer and a hole blocking layer are also included in the electron transport layer. A single layer or plural layers may be provided as an electron transport layer. Conventionally, when using a single electron transport layer or plural electron transport layers, an electron transport material used for the electron transport layer adjacent to the cathode side with respect to an emission layer may have a function to transfer electrons injected from the cathode to the emission layer, and any one can be selected from commonly known compounds to utilize the material. Examples thereof include a nitro-substituted fluorene derivative, a diphenylquinone derivative, a thiopyradincoxide derivative, carbodiimide, a fluorenylidenemethane derivative, anthraquinonedimethane, an enthrone derivative, an oxadiazole derivative and so forth. Further, a thiadiazole derivative in which an oxygen atom in the oxadiazole ring of the above-described oxadiazole derivative is substituted by a sulfur atom, and a quinoxaline derivative having a quinoxaline ring known as an electron accepting group are also usable as an electron transport material. Further, a polymer material in which these materials are introduced into a polymer chain, or are used for a main chain of a polymer is also usable. Further, a metal complex of a 8-quinolinol derivative such as tris (8-quinolinol) aluminum ($Alq_3$), tris (5,7-dichloro-8-quinolinol) aluminum, tris (5,7-dibromo-8-quinolinol) aluminum, tris (2-methyl-8-quinolinol) aluminum, tris (5-methyl-8-quinolinol) aluminum and bis(8-quinolinol) zinc (Znq); and metal complexes in which a central metal of the aforesaid metal complexes is substituted by In, Mg, Cu, Ca, Sn, Ga or Pb, can be also preferably used as an electron transport material. In addition, metal-free or metal phthalocyanine, or those the terminal of which is substituted by an alkyl group and a sulfonic acid group, can be preferably utilized as an electron transport material, and similarly to the hole injection layer and the hole transfer layer, inorganic semiconductors such as an n type-Si, an n type-SiC and so forth are usable as an electron transport material. The electron transport layer can be formed via preparation of a thin film layer formed of the above-described electron transport material by a vacuum evaporation method, a spin coating method, a casting method, a printing method including an ink-jet method, an LB method or the like. The thickness of the electron transport layer is not specifically limited, but the electron transport layer conventionally has an approximate thickness of 5 nm to 5 µm, and preferably has a thickness of 5-200 nm. The electron transport layer may have a single layer structure containing one material or two kinds of materials described above. Also usable is an electron transport material appearing to exhibit a property of an n type semiconductor in which impurities are doped. Examples thereof include those described in Japanese Patent O.P.I. Publication No. 4-297076, Japanese Patent O.P.I. Publication No. 10-270172, Japanese Patent Publication No. 2000-196140, Japanese Patent O.P.I. Publication No. 2001-102175, J. Appl. Phys., 95, 5773 (2004), and so forth. It is preferable to use an electron transport material appearing to exhibit such an n type semiconductor property, since a low power consumption device can be prepared.

[Second Electrode]

The second electrode of the present invention is a cathode in the case of an organic EL device. The second electrode section in the present invention may be composed of a single layer made of a conductive material, but in addition to a material exhibiting conductivity, a resin to hold this may be used in combination. As to the conductive material for the second electrode section, used are a metal (called an electron injection metal), an alloy, an electrically conductive compound and a mixture thereof which have a small work function (4 eV or less) as electrode materials. Examples of such an electrode material include sodium, a sodium-potassium alloy, magnesium, lithium, a magnesium/copper mixture, a magnesium/silver mixture, a magnesium/aluminum mixture, a magnesium/indium mixture, an aluminum/aluminium oxide ($Al_2O_3$) mixture, indium, a lithium/aluminium mixture, a rare earth metal and so forth.

Of these, from the viewpoint of an electron injection property and durability to oxidation and so forth, a mixture in which an electron injection metal is mixed with the second metal as a stable metal having larger work function than that of the electron injection metal is suitable. Examples of the mixture include a magnesium/silver mixture, a magnesium/aluminum mixture, a magnesium/indium mixture, an aluminum/aluminium oxide ($Al_2O_3$) mixture, a lithium/aluminum mixture, aluminium and so forth. The cathode can be prepared by forming a thin film via a method of evaporating or sputtering the electrode material. Further, the cathode preferably has a sheet resistance of at most several hundreds $\Omega/\square$, and generally has a film thickness of 10 nm-5 μm and preferably has a film thickness of 50-200 nm to be selected.

When a metal material is used as a conductive material for the second electrode section, light coming to the second electrode side is reflected returns to the first transparent electrode section side. A metal nanowire of the first transparent electrode section scatters or reflects a part of light backward, but when a metal material is used as a conductive material of the second electrode section, this light becomes reusable, whereby a taking-out efficiency thereof is improved.

[Organic Photoelectric Conversion Device]

Next, the organic photoelectric conversion device will be described. It is a feature that the organic photoelectric conversion device of the present invention has a structure in which the first transparent electrode, a photoelectric conversion layer having a bulk heterojunction structure (a p type semiconductor layer and an n type semiconductor layer) (hereinafter, referred to also as "bulk heterojunction layer") and the second electrode are laminated, and a transparent conductive layer of the present invention is provided between the first transparent electrode and the photoelectric conversion layer.

Further, an intermediate layer such as an electron transparent layer may be also provided between the photoelectric conversion layer and the second electrode.

[Photoelectric Conversion Layer]

The photoelectric conversion layer is a layer by which light energy is converted into electrical energy, and is composed of a bulk heterojunction layer in which a p type semiconductor material and an n type semiconductor material are mixed with uniformity.

The p type semiconductor relatively serves as an electron donor (donor), and then type semiconductor relatively serves as an electron acceptor (acceptor).

Herein, the electron donor and the electron acceptor are an electron donor and an electron acceptor in which electrons are moved from the electron donor to the electron acceptor when absorbing light to form a pair of a hole and an electron (charge-separated state), and are those donating and accepting electrons via photoreaction without simply donating or accepting electrons like an electrode.

As the p type semiconductor material, cited are various condensed polycyclic aromatic compounds and conjugated compounds.

Examples of the condensed polycyclic aromatic compounds include anthracene, tetracene, pentacene, hexacene, heptacene, chrysene, picene, fuhninene, pyrene, peropyrene, perylene, terylene, quoterylene, coronene, ovalene, circumanthracene, bisanthene, zethrene, heptazethrene, pyranthrene, violanthene, isoviolanthene, circobiphenyl, anthradithiophene, and a derivative or a precursor thereof.

Examples of conjugated compounds include polythiophene or its oligomer, polypyrrole or its oligomer, polyaniline, polyphenylene or its oligomer, polyphenylene vinylene or its oligomer, polythienylene or its oligomer, polyacetylene, a tetrathiafulvalene compound, a quinone compound, a cyano compound such as tetracyanoquinodimethane or the like, fullerene, and a derivative or a mixture thereof.

Further, specifically among polythiophene and oligomers thereof, suitably usable are oligomers such as α-sexithiophene as a hexamer, α,ω-dihexyl-α-sexithiophene, cc, α-dihexyl-α-Quinquethiophene, α,ω-bis(3-butoxypropyl)-α-sexithiophene and so forth.

In addition, examples of polymeric p type semiconductors include polyacetylene, polyparaphenylene, polypyrrole, polyparaphenylene sulfide, polythiophene, polyphenylene vinylene, polycarbazole, polyisothianaphthene, polyheptadiyne, polyquinoline, polyaniline, and so forth. Further, examples thereof include substituted-unsubstituted alternating copolymerization polythiophene described in Japanese Patent O.P.I Publication No. 2006-36755 and so forth; a polymer having a condensed cyclic thiophene structure described in Japanese Patent O.P.I. Publication No. 2007-51289, Japanese Patent O.P.I. Publication No. 2005-76030, J. Amer. Chem. Soc., 2007, p 4112, J. Amer. Chem. Soc., 2007, p 7246 and so forth; and a thiophene copolymer described in WO2008/000664, Adv. Mater., 2007, p 4160, Macromolecules, 2007. Vol. 40, p 1981 and so forth.

Further, usable examples thereof include porphyrin, copper phthalocyanine, an organic molecule complex such as a tetrathiafulvalene (TTF)-tetracyanoquinodimethane (TCNQ) complex, a bisethylene tetrathiafulvalene (BEDTTTF)-perchloric acid complex, a BEDTTTF-iodine complex, a TCNQ-iodine complex or the like, fullerene such as C60, C70, C76, C78, C84 or the like, a carbon nanotube such as SWNT or the hie, a dye such as merocyanine dyes, hemicyanine dyes or the like, a σ conjugated polymer such as polysilane, polygermane or the like, and organic • inorganic blending material described in Japanese Patent O.P.I. Publication No. 2000-260999.

Of these π conjugated materials, preferable is at least one selected from the group consisting of condensed polycyclic aromatic compounds such as pentacenes and so forth, fullerenes, condensed cyclic tetracarboxylic acid diimides, metal phthalocyanines, and metal porphyrins. Further, pentacenes are more preferable.

Examples of pentacenes include pentacene derivatives each having a substituent described in WO 03/16599, WO 03/28125, U.S. Pat. No. 6,690,029, Japanese Patent O.P.I. Publication No. 2004-107216 and so forth; pentacene precursors described in US 2003/136964; substituted acenes and their derivatives described in J. Amer. Chem. Soc., vol. 127, No. 14, 4986, and so forth.

Of these compounds, preferable is a compound capable of forming a crystalline thin film after drying, together with high solubility to an organic solvent so as to make a solution process to be possible, and capable of achieving high mobility. Examples of such a compound include an acene based compound substituted by a trialkyl silylethynyl group described in J. Amer. Chem. Soc., vol. 123, No. p 9482; J. Amer. Chem. Soc., vol. 130 (2008), No. 9, 2706 and so forth: a pentacene precursor described in US 2003/136964 and so forth; and a precursor type compound (precursor) such as a porphyrin precursor and so forth described in Japanese Patent O.P.I. Publication No. 2007-224019 and so forth.

Of these, the latter precursor type is more preferably usable. Since the precursor type is much more likely to be dissolved after conversion, and no bulk heterojunction layer is to be dissolved during formation of a hole transport layer • electron transport layer • hole blocking layer • electron blocking layer and so forth on the bulk heterojunction layer via a solution process, a material constituting the foregoing layer and a material forming the bulk heterojunction layer are not to be mixed, so that this is the reason why efficiency and lifetime can be further improved.

The p type semiconductor material is preferably a compound having been converted to the p type semiconductor material by thermally producing chemical structural change by a method of exposing a p type semiconductor material precursor to vapor of a compound to produce heat reaction, light reaction, radiation reaction or chemical reaction. Among them, a compound to produce chemical structural change via heat is preferable.

Examples of the p type semiconductor material include fullerene, octaazaporphyrin, a perfluoro type of the p type semiconductor (perfluoropentacene, perfluorophthalocyanine and so forth), and a polymeric compound containing aromatic carboxylic acid anhydride or an imide compound such as naphthalene tetracarboxylic acid anhydride, naphthalene tetracarboxylic acid diimide, perylene tetracarboxylic acid anhydride, perylene tetracarboxylic acid diimide or the like as a moiety.

Of these, a fullerene-containing polymeric compound is preferable. As a fullerene-containing polymeric compound, exemplified is a polymeric compound having fullerene C60, fullerene C70, fullerene C76, fullerene C78, fullerene CM, fullerene C240, fullerene C540, mixed fullerene, a fullerene nanotube, a multilayer nanotube, a single layer nanotube, a nanohorn (cone type) or the like in a moiety. Of these fullerene-containing polymeric compounds, a polymeric compound (derivative) having fullerene C60 in a moiety is preferable.

A fullerene-containing polymer is classified into a polymer having a pendant of fullerene from a main chain of the polymer, and a polymer in which fullerence is contained in the main chain of the polymer, but the polymer in which fullerence is contained in the main chain of the polymer is preferable.

It is assumed that this is because high density packing can be made when solidifying a polymer in which fullerene is contained in the main chain because of no branched structure of a polymer, and as a result, high mobility can be obtained.

Exemplified examples of methods each of forming a bulk heterojunction layer in which an electron acceptor and an electron donor are mixed include an evaporation method, coating methods including a casting method and a spin coating method, and so forth.

For a structure to utilize a photoelectric conversion device as a photoelectric conversion material such as a solar cell, a single layer of the photoelectric conversion device may be used, and a multilayer of the photoelectric conversion device may be also used.

Further, the photoelectric conversion material is preferably sealed by a commonly known technique in order to protect deterioration thereof caused by oxygen in the environment, water content and so forth.

[The First Transparent Electrode]

In the present invention, as the first transparent electrode, provided is one in which a commonly known transparent conductive electrode layer such as an ITO layer, a ZnO layer, a metal layer as a thin film, or the like is formed on the entire surface of a transparent substrate, or one in which the aftermentioned stripe-shaped electrode, mesh-shaped electrode, random mesh-shaped electrode or the like is formed, but the present invention is not limited thereto. In response to the large-area product, the first transparent electrode of the present invention may be one possessing an electrode composed of an optically opaque section and a transparent window section. As a material of which the foregoing optically opaque section is formed, metal is preferable in view of good conductivity, and examples of the metal material include gold, silver, copper, iron, nickel, chromium and so forth. Further, the metal in the conductive section may be an alloy, and the metal layer may be composed of a single layer or a multilayer.

In the present invention, shape of the electrode is not specifically limited, but the conductive section is stripe-shaped, mesh-shaped, or random mesh-shaped.

[Stripe-Shaped or Mesh-Shaped Structure]

A method of forming an electrode in which a conductive section is stripe-shaped or mesh-shaped is not specifically limited, and commonly known methods are usable. For example, a metal layer is formed on the entire surface of a substrate via a commonly known photolithographic method. Specifically, a conductor layer is formed on the entire surface of a substrate by using at least one of physical and chemical forming methods such as evaporation, sputtering, plating and so forth, or after laminating metal foils on a substrate with an adhesive, etching is carried out by a commonly known photolithographic method to be processed into a desired stripe shape or mesh shape.

As other methods, usable area method of printing ink containing metal particles, into a desired shape, and a method of conducting a plating treatment after gravure-printing or coating catalyst ink capable of plating, into a desired shape via an ink-jet technique. Further, as another method, a metal for which a silver halide photographic technique is applied is usable. The metal for which a silver halide photographic technique can be implemented by referring to [0076]-[0112] and Examples of Japanese Patent O.P.I. Publication No. 2009-140750. The method of conducting a plating treatment after gravure-printing the catalyst ink capable of plating can be implemented by referring to Japanese Patent O.P.I. Publication No. 2007-281290.

[Random Mesh Structure]

As to a random mesh structure, usable is a method of spontaneously forming a disordered mesh structure of conductive particles by coating a solution containing metal particles, followed by drying, as described in Published Japanese translation of PCT international Publication No. 2005-530005, for example.

As another method, usable is a method by which a random mesh structure of metal nanowires is formed by coating a coating solution containing metal nanowires as described in Published Japanese translation of PCT international Publication No. 2009-505358, for example.

The metal wire is referred to as a fibrous structure in which metal elements are main constituent elements. Specifically, the metal wire of the present invention means a large number of fibrous structures each having a minor axis from size in atomic scale to size in nanometer.

In order to form a long conductive path with one metal nanowire, metal nanowires preferably has a mean length of 3 μm or more; more preferably has a mean length of 3-500 μm; and still more preferably has a mean length of 3-300 μm. In addition, a relative standard deviation of the length is preferably 40% or less. The mean minor axis is not specifically limited, but it is preferably small in view of transparency, and in contrast, it is preferably large in view of conductivity. The metal nanowire preferably has a mean minor axis of 10-300 nm, and more preferably has a mean minor axis of 30-200 nm. In addition, a relative standard deviation of the minor axis is preferably 20% or less. The metal nanowire preferably has a coating amount of 0.005-0.5 g/m$^2$, and more preferably has a coating amount of 0.01-0.2 g/m$^2$.

As metal used for the metal nanowire, copper, iron, cobalt, gold, silver or the like is usable, but silver is preferable in view of conductivity. Further, the metal may be used singly, but one metal as a main component and at least one other metal in an arbitrary ratio may be contained in order to support conductivity and stability (sulfurization or oxidation resistance of metal nanowire and migration resistance) at the same time.

A method of manufacturing metal nanowires is not specifically limited, and commonly known methods such as a liquid phase method or a vapor deposition method, for example, are usable. In addition, the specific manufacturing method is not also specifically limited, and commonly known manufacturing methods are also usable. For example, a method of manufacturing Ag nanowires may be cited in Adv. Mater. 2002, 14, 833-837 and Chem. Mater. 2002, 14, 4736-4745; a method of manufacturing Au nanowires may be cited in Japanese Patent O.P.I. Publication No. 2006-233252; a method of manufacturing Cu nanowires may be cited in Japanese Patent O.P.I. Publication No. 2002-266007; and a method of manufacturing Co nanowires may be cited in Japanese Patent O.P.I Publication No. 2004-149871. Since the method of manufacturing Ag nanowires as described above is a method by which the Ag nanowires can be easily prepared in an aqueous solution, and silver has the largest conductivity among metals, this method is preferably applicable.

[Wet Washing]

Foreign matter and impurities present on the surface of an electrode or inside the electrode largely influence performance such as lifetime or the like of an organic electronic device. For this reason, in the case of the present invention, a transparent conductive layer may be subjected to wet washing. The wet washing means that the transparent conductive layer is washed with washing liquid as an aqueous solvent, and impurities in the transparent conductive layer and foreign matter on the layer can be eliminated to obtain a highly surface-smooth conductive layer having a small amount of impurities. The aqueous solvent means a solvent in which water occupies a content of 50% by weight or more. Of course, it may be pure water containing no other solvent. Ultrapure water is further preferable in view of a small amount of foreign matter in the washing liquid. The ultrapure water means water having a total organic carbon TOC of less than 0.05 mg/L, and a specific resistance of roughly 18 MΩ·cm at a water temperature of 25° C., which has been measured by a method in accordance with JIS K0551. The component other than water in the aqueous solvent is not specifically limited, as long as it is a solvent compatibly dissolved in water, but an alcohol based solvent is preferably usable, and specifically isopropyl alcohol having a boiling point roughly similar to that of water is preferably used.

Further, in order to improve wettability of the transparent conductive layer, the washing liquid may contain a surfactant. Further, the washing liquid preferably one which has passed through each of various filters, as long as filter components are not eluted, since the foreign matter in the washing liquid is to be reduced.

[Transparent Substrate]

The transparent substrate in the present invention is not specifically limited, as long as it exhibits transparency. For example, a glass substrate, a resin substrate, a resin film and so forth are preferably listed in view of excellent hardness of a substrate, easy formation of a conductive layer provided on the substrate surface, but a transparent resin film is preferably used in view of suitability with a multi-stage washing treatment, and performance such as a lightweight property, flexibility or the like.

In the present invention, the transparent resin film preferably usable as a transparent substrate is not specifically limited, and its material, shape, structure, thickness and so forth can be appropriately chosen from the commonly known. Examples of the material include a polyester based resin film such as polyethylene terephthalate (PET), polyethylene naphthalate (PEN), modified polyester or the like; a polyolefin based resin film such as a polyethylene (PE) resin film, a polypropylene (PP) resin film, a polystyrene resin film, a cyclic olefin based resin or the like; a vinyl based resin film such as polyvinylchloride, polyvinylidene chloride or the like; a polyether ether ketone (PEEK) resin film, a polysulfone (PSF) resin film, a polyethersulfone (PES) resin film, a polycarbonate (PC) resin film, a polyamide resin film, a polyimide resin film, an acrylic resin film, a triacetyl cellulose (TAC) resin film and so forth, but when the resin film has a transmittance of 80% or more in the visible wavelength range of 380-780 nm, it is preferably applicable as a transparent resin film of the present invention. Specifically, a biaxially stretched polyethylene terephthalate film, a biaxially stretched polyethylene naphthalate film, a polyethersulfone film and a polycarbonate film are preferable in view of transparency, heat resistance, easy handling, strength and cost, and a biaxially stretched polyethylene terephthalate film and a biaxially stretched polyethylene naphthalate film are more preferable.

In order to obtain wettability and an adhesion property of a coating solution, a transparent substrate used in the present invention can be subjected to a surface treatment, and an adhesion-assisting layer can be formed on the transparent substrate. A conventionally known technique is usable for the surface treatment and the adhesion-assisting layer. For example, examples of the surface treatment include a surface activation treatment such as a corona discharge treatment, a flame treatment, a UV treatment, a high-frequency treatment, a glow discharge treatment, an activation plasma treatment, a laser treatment or the like.

Further, examples of the adhesion-assisting layer include polyester, polyamide, polyurethane, a vinyl based copolymer, a butadiene based copolymer, an acrylic copolymer, a vinylidene based copolymer, an epoxy based copolymer and so forth. The adhesion-assisting layer may be composed of a single layer, but may be composed of at least two layers in order to improve adhesion.

Further, a hybrid film made of an inorganic substance, an organic substance or both substances thereof may be formed on the surface or the backsurface of a transparent substrate. Preferable is a barrier film in which the water vapor permeability at a temperature of 25±0.5° C. and a relative humidity of 90±2% RH is $1\times10^{-3}$ g/(m$^2$·24 h) or less, measured in accordance with JIS K 7129-1992. Further, preferable is a high barrier film in which the oxygen permeability is $1\times10^{-3}$ ml/m$^2$·24 h·atm or less, and the water vapor permeability at a temperature of 25±0.5° C. and a relative humidity of 90±2% RH is $1\times10^{-3}$ g/m$^2$·24 h or less, measured in accordance with JIS K 7126-1987.

The material to form a barrier film provided on the surface or the back surface of a transparent substrate in order to prepare a high barrier film may be a material having a function of inhibiting water content, oxygen or the like, even though deteriorating the device. For example, silicon oxide, silicon dioxide or silicon nitride is usable. Further, in order to improve brittleness of the film, it is more preferable to introduce a multilayer structure made from the inorganic layer and the organic layer therein. The order to laminate the inorganic layer end the organic layer is not specifically limited, but it is preferable that both the inorganic layer and the organic layer are alternately laminated more than once.

EXAMPLE

Next, the present invention will now be specifically described referring to examples, but the present invention is not limited thereto. Incidentally, "%" used in the examples represents "% by weight", unless otherwise specifically mentioned.

Synthetic Example of Polymer A

<Living radical polymerization via ATRP (Atom Transfer Radical Polymerization) Method>
(Synthesis of Initiator 1)

Synthetic Example 1

Synthesis of methoxy-capped oligoethylene glycol-2-bromoisobutylate (initiator 1)

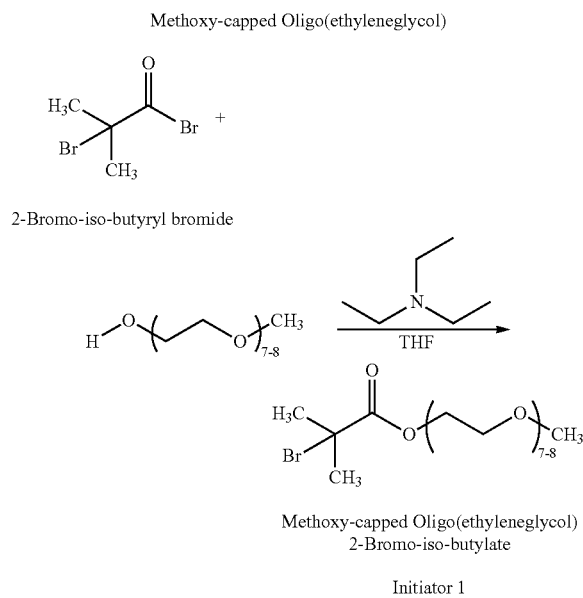

Initiator 1

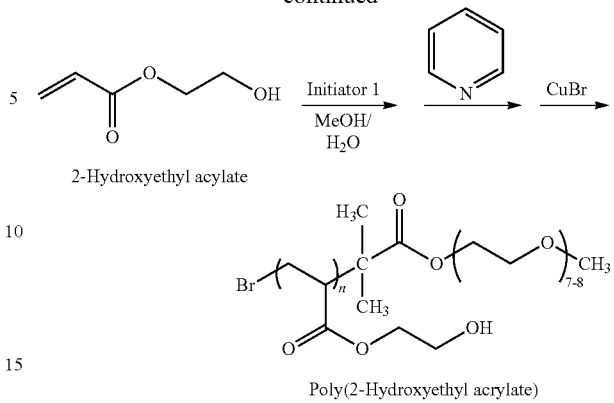

Poly(2-Hydroxyethyl acrylate)

In a 50 ml three necked flask, charged were 7.3 g (35 mmol) of 2-bromoisobutyryl bromide, 2.48 g (35 mmol) of triethylamine, and 20 ml of THF. The inner temperature of the resulting solution was maintained at 0° C., employing an ice bath. Into the solution, dropwise added were 30 ml of a 33% THF solution of 10 g (23 mmol) of methoxy-capped oligoethylene glycol (ethylene glycol units 7 to 8, produced by Laporte Specialties Co., Ltd.). After stirring the solution for 30 minutes, temperature of the solution was raised to room temperature, and the solution was further stirred for 4 hours. After the TIE was eliminated at reduced pressure with a rotary evaporator. The residue was dissolved in diethyl ether, and transferred into a separation funnel. After water was added in the separation funnel to wash the ether layer 3 times, the ether layer was dried with MgSO$_4$. Ether was removed therefrom at reduced pressure with a rotary evaporator to obtain 8.2 g (a yield of 73%) of initiator 1.

Synthetic Example 2

P-1: poly(2-hydroxyethyl acrylate)

Into a Schlenk flask, charged were 500 mg (1.02 mmol) of initiator 1, 4.64 g (40 mmol) of 2-hydroxyethyl acrylate (produced by Tokyo Kasai Co., Ltd.) and 5 ml of a water-methanol mixed solvent {50:50 (v/v %)}, and the Schlenk flask was immersed in liquid nitrogen at reduced pressure for 10 minutes. The Schlenk flask was removed from liquid nitrogen, and nitrogen gas substitution was carried out after 5 minutes. After this operation, was repeated three times, 400 mg (2.56 mmol) of bipyridine and 147 mg (1.02 mmol) of CuBr were added therein under nitrogen atmosphere and stirring was carried out at 20° C. After 30 minutes, the reaction solution was dropped onto a Kiriyama Robto (4 cm diameter) provided with a filter paper and silica to collect the reaction solution at reduced pressure. The solvent was removed therefrom at reduced pressure with a rotary evaporator, followed by drying at reduced pressure at 50° C. for 3 hours. As a result, 2.60 g (a yield of 84%) of water-soluble binder P-1 having a number average molecular weight of 13100, a molecular weight distribution of 1.17, and a content of 0% for a number average molecular weight of less than 1000 were obtained.

The structure and molecular weight of PHEA-1 each were measured with $^1$H-NMR (400 MHz, manufactured by JEOL Ltd.) and GPC (Waters 2695, manufactured by Waters Co., Ltd.).

<Conditions of GPC measurement>

Apparatus: Wagers 2695 (Separations Module)

Detector. Waters 2414 (Refractive Index Detector)

Column: Shodex Asahipak GF-7M HQ

Eluant: Dimethylformamide (20 mM LiBr)

Flow rate: 1.0 ml/min

Temperature: 40° C.

Each of P-2: polyhydroxyethylvinyl ether having a number average molecular weight of 20000, and a content of 0% for a number average molecular weight of less than 1000, and P-3: polyhydroxyethyl acrylamide having a number average molecular weight of approximately 20000, and a content of 0% for a number average molecular weight of less than 1000 was obtained similarly to the above-described, except that hydroxyethylvinyl ether and hydroxyethyl acrylate were used as monomers.

Further, P-4: a poly (2-hydroxyethyl acrylate/polyhydroxy ethylvinyl ether) copolymer having a number average molecular weight of approximately 20000, and a content of 0% for a number average molecular weight of less than 1000 was obtained similarly to the foregoing, except that equimolar 2-hydroxyethyl acrylate and 2-hydroxyethylvinyl ether were used

[Transparent Substrate]

Transparent substrate 1 exhibiting a transparent gas barrier property, in which 3 layers of units each unit having a low density layer, a medium density layer, a high density layer and a medium density layer are laminated on one surface of a biaxially stretched PEN film was prepared via an atmospheric plasma discharge treatment method. When measuring the water vapor permeability by a method in accordance with JIS K7129-1992, a water vapor permeability of $10^{-3}$ g/(m$^2$·24 h) or less was obtained.

When measuring the oxygen permeability by a method in accordance with JIS K7126-1987, an oxygen permeability of $10^{-3}$ ml/(m$^2$·24 hr·MPa) or less was obtained.

[First Transparent Electrode]

[ITO Substrate]

After patterning was conducted on a substrate where a 150 nm thick ITO (indium tin oxide) film was formed on the surface of transparent substrate 1 on which no barrier layer was provided, via a photolithographic method, the substrate was immersed in isopropyl alcohol, followed by conducting an ultrasonic cleaning treatment for 10 minutes employing an ultrasonic cleaner BRANSONIC 3510J-MT substrate.

[Ag Nanowire Substrate]

Further, after an Ag nanowire dispersion was coated on the surface of transparent substrate 1 on which no barrier layer was provided by a bar coating method so as to make a coating amount of the Ag nanowire to be 0.06 g/m$^2$, followed by heat-drying at 120° C. for 20 minutes, the following metal particle-eliminating liquid was subjected to pattern-printing conducted via screen printing, and the metal particle-eliminating liquid was removed therefrom by washing with water to prepare an Ag nanowire substrate.

As to an Ag nanowire dispersion, referring to a method described in Adv. Mater., 2002, 14, 833-837, after Ag nanowires each having a mean length of 35 μm were prepared employing PVK K30 (a molecular weight of 50000, produced by ISP technologies, Inc.), and the Ag nanowires were filtrated using an ultrafiltration membrane and were subjected to a washing treatment, they were dispersed again in an aqueous solution in which 25% by weight of hydroxypropylmethyl cellulose 60SH-50 (prepared by Shin-Etsu Chemical Co., Ltd.) were added with respect to Ag, to prepare an Ag nanowire dispersion. Further, those having the following compositions were employed for the metal particle remover liquid.

| <Preparation of metal particle remover liquid> | |
|---|---|
| Ethylene diamine tetraacetic acid ferric sulfate ammonium | 60 g |
| Ethylene diamine tetraacetic acid | 2.0 g |
| Sodium metabisulfite | 15 g |
| Ammonium thiosulfate | 70 g |
| Maleic acid | 5.0 g |

Pure water was added therewith to male one litter and pH was adjusted to 5.5 with a sulfuric acid or ammonia water to prepare metal particle remover liquid. Further, viscosity of the metal particle remover liquid was adjusted to 10 Pa·s (10000 cP) with carboxymethyl cellulose sodium C5013, produced by SIGMA-ALDRICH CORP. (hereinafter, abbreviated to CMC).

[Cu Mesh Substrate]

A Cu mesh was prepared on the support of transparent substrate 1 on which no barrier layer was produced, as the first transparent electrode, and was subjected to patterning with the following metal remover liquid to prepare a Cu mesh substrate.

A self-dispersible carbon black solution CAB-O-JET300 was added into catalyst ink JIPD-7 containing palladium particles so as to make a content ratio of carbon black to catalyst ink to be 10.0% by weight, and SURFYNOL 465 (produced by Nissin Chemical Co., Ltd.) was further added therein to prepare conductive ink having a surface tension of 48 mN/m at 25° C.

After conductive ink was set in an ink-jet printer in which installed was a piezo type head equipped with a pressure-application means and an electric field-application means as an ink-jet recording head, which has a nozzle opening diameter of 25 μm, a driving frequency of 12 kHz, 128 as the number of nozzles, a nozzle density of 180 dpi (dpi represents the number of dots per inch, that is, 2.54 cm), and lattice-shaped conductive fine-lines each having a line width of 10 μm, a dry film thickness of 0.5 μm, and a line interval of 300 μm were formed on a substrate, drying was carried out.

Next, the resulting was immersed in a high-speed electroless Cu plating solution CU-5100 at 55° C. for 10 minutes, followed by washing, and was subsequently subjected to an electroless plating treatment to prepare an electrode having a plating thickness of 3 μm.

[Formation of Transparent Conductive Layer]

Each of solutions A-L, in which the following conductive polymer and aqueous binder were mixed, was prepared, and was coated on the resulting ITO substrate by an extrusion method by adjusting slit intervals of the extrusion head, so as to give a dry film thickness of 100 nm or 300 nm, and undesired portions were wiped out via wiping, followed by heat-drying at 150° C. for 20 minutes to prepare each of ITO electrodes 1-16, and 21-24.

| A: Conductive polymer layer coating solution | |
|---|---|
| PEDOT-PSS CLEVIOS PH 510 (a solid content of 1.89%) produced by H. C. Starck GmbH, singly | |
| B: Conductive polymer and binder layer coating solution (70%) | |
| PEDOT-PSS CLEVIOS PH 510 (a solid content of 1.89%) produced by H. C. Starck GmbH | 1.587 g |
| Polyhydroxyethyl acrylate (P-1, an aqueous solution of a solid content of 20%) | 0.350 g |
| C: Conductive polymer and binder layer coating solution (50%) | |
| PEDOT-PSS CLEVIOS PH 510 (a solid content of 1.89%) produced by H. C. Starck GmbH | 2.645 g |
| Polyhydroxyethyl acrylate (P-1, an aqueous solution of a solid content of 20%) | 0.250 g |
| D: Conductive polymer and binder layer coating solution (20%) | |
| PEDOT-PSS CLEVIOS PH 510 (a solid content of 1.89%) produced by H. C. Starck GmbH | 4.233 g |
| Poly (2-hydroxyethyl acrylate) (P-1, an aqueous solution of a solid content of 20%) | 0.100 g |
| E: Conductive polymer and binder layer coating solution | |
| PEDOT-PSS CLEVIOS PH 510 (a solid content of 1.89%) produced by H. C. Starck GmbH | 1.59 g |
| Poly (2-hydroxyethylvinyl ether) (P-2, an aqueous solution of a solid content of 20%) | 0.350 g |
| F: Conductive polymer and binder layer coating solution | |
| PEDOT-PSS CLEVIOS PH 510 (a solid content of 1.89%) produced by H. C. Starck GmbH | 1.59 g |
| Poly (2-hydroxyethylakryl amide) (P-3, an aqueous solution of a solid content of 20%) | 0.350 g |
| G: Conductive polymer and binder layer coating solution | |
| PEDOT-PSS CLEVIOS PH 510 (a solid content of 1.89%) produced by H. C. Starck GmbH | 1.59 g |
| Polyhydroxyethyl acrylate (P-1, an aqueous solution of a solid content of 20%) | 0.35 g |
| Dimethyl sulfoxide | 0.10 g |
| H: Conductive polymer and binder layer coating solution | |
| PEDOT-PSS CLEVIOS PH 510 (a solid content of 1.89%) produced by H. C. Starck GmbH | 1.59 g |
| Aqueous polyester (Vylonal MD1400, a solid content of 15%) produced by Toyobo Co., Ltd. | 0.47 g |
| Dimethyl sulfoxide | 0.10 g |
| Block isocyanate (Elastron BN-11) produced by DAI-ICHI KOGYO SEIYAKU Co., Ltd. | 0.09 g |
| Curing Catalyst (Elastron CAT-21) produced by DAI-ICHI KOGYO SEIYAKU Co., Ltd | 0.004 g |
| I: Conductive polymer and binder layer coating solution | |
| PEDOT-PSS CLEVIOS PH 510 (a solid content of 1.89%) produced by H. C. Starck GmbH | 1.59 g |
| Polyvinyl alcohol (PVA-235, an aqueous solution of a solid content of 2%) produced by KUREHA Corporation | 3.50 g |
| Dimethyl sulfoxide | 0.10 g |
| Epoxy based crosslinking agent (DECONAL EX-521) produced by Nagase ChemteX Corp. | 0.5 g |
| J: Conductive polymer layer coating solution | |
| PEDOT-PSS CLEVIOS P AI 4083 (a solid content of 1.5%) produced by H. C. Starck GmbH, singly | |
| K: Conductive polymer and binder layer coating solution (70%) | |
| PEDOT-PSS CLEVIOS P AI 4083 (a solid content of 1.5%) produced by H. C. Starck GmbH | 2.000 g |
| Polyhydroxyethyl acrylate (P-1, an aqueous solution of a solid content of 20%) | 0.350 g |
| L: Conductive polymer and binder layer coating solution | |
| PEDOT-PSS CLEVIOS PH 510 (a solid content of 1.89%) produced by H. C. Starck GmbH | 1.59 g |
| Aqueous polyester (Vylonal MD1400, a solid content of 15%) produced by Toyobo Co., Ltd. | 0.47 g |
| Dimethyl sulfoxide | 0.10 g |
| M: Conductive polymer and binder layer coating solution (70%) | |
| PEDOT-PSS CLEVIOS PH 510 (a solid content of 1.89%) produced by H. C. Starck GmbH | 1.587 g |
| Poly (2-hydroxyethyl acrylate/polyhydroxyethylvinyl ether) (P-4, an aqueous solution of a solid content of 20%) | 0.350 g |

The above-described conductive polymer and aqueous binder coating solutions B-G, K and M each formed a crosslinking structure between PEDOT-PSS and a polyhydroxy group in the molecule, and improved hardness in comparison to that of the singly providing layer, as to film strength after heat-drying at 150° C. for 20 minutes.

Further, coating solutions A, H, I, J and L each was also subjected to similarly heat-drying at 150° C. for 20 minutes after coating.

Further, each of the foregoing coating solutions A and B was coated on an Ag nanowire substrate and on a Cu mesh substrate by the same method, followed by patterning and drying to prepare electrodes composed of Ag nanowire (referred to also as Ag nanowire electrodes) 17 and 18, and electrodes composed of Cu mesh (referred to also as Cu mesh electrodes) 19 and 20. Herein, coating was carried out on a Cu mesh substrate in such a way that the conductive polymer and aqueous binder layer had a layer thickness of 500 nm. After coating, heat-drying was similarly conducted at 150° C. for 20 minutes.

Transparency, conductivity and surface-smoothness of each of the resulting electrodes were evaluated.
(Transparency)

As to evaluations of transparency, the total optical transmittance was measured employing a haze meter NDH 5000 manufactured by Tokyo Denshoku Co., Ltd. The total optical transmittance is preferably 75% in view of light loss produced by a device.
A: 80% or more
B: at least 75% and less than 80%
C: at least 70% and less than 75%.
D: at least 0% and less than 70%

(Conductivity and Surface-Smoothness of Transparent Conductive Layer)

As to evaluations of conductivity of transparent conductive layers, each of coating solutions A-L was coated on a glass substrate by an extrusion method so as to give the film thickness described in Table 1, after adjusting slit intervals of an extrusion head, followed by heat-drying at 150° C. for 20 minutes. Then, the surface resistance of these substrates was measured by a resistivity meter (Loresta GP (MCP-T610 type), manufactured by Mitsubishi Chemical Analytech Co., Ltd.). As to the sample to be unmeasurable because of over-range, after a sample having a square, 3 cm on a side was prepared, a width of about 2 mm from each of the ends of two sides opposed to each other on the conductive polymer-containing layer was Ag paste-coated to apply a DC voltage of 1 V employing a source major unit 2400 type manufactured by KEITHLEY Instruments Inc., and IV divided by the current value when using the measured current value was designated as a value of surface resistance. The surface resistance is preferably $1 \times 10^7 \Omega/\square$ or less in view of conductivity. After measuring all the resulting coating solutions, the surface resistance was all found to be $1 \times 10^7 \Omega/\square$ or less.

In order to evaluate the surface-smoothness, surface roughness Ra of the sample of a sample used for evaluation of conductivity was measured employing an atomic force microscope (AFM) (an SPI 3800N probe station and SPA 400 multifunctional type unit (manufactured by Seiko Instruments Co., Ltd.). Employing a cantilever S1-DF20 (manufactured by Seiko Instruments Co., Ltd.), a square, 10 μm on a side as a measuring region was measured at a scanning frequency of 1 Hz under the DFM mode (Dynamic Force Mode), a resonant frequency of 120-150 kHz, and a spring constant of 12-20 μm. The surface-smoothness was evaluated via arithmetic average smoothness Ra obtained in accordance with JIS B601 (1994). As a transparent electrode, the arithmetic average smoothness is preferably 50 nm or less. After measuring all the resulting coating solutions, the arithmetic average smoothness was all found to be 50 nm or less.

In addition, an ITO substrate was placed as comparative electrode 25.

The composition of a transparent conductive layer in each electrode, and evaluated results thereof are shown in Table 1.

TABLE 1

| | | | | Components of transparent conductive layer | | | | |
|---|---|---|---|---|---|---|---|---|
| Electrode No. | First transparent electrode | Coating solution | Conductive polymer | Aqueous binder | Ratio of conductive polymer to aqueous binder | Film thickness | Transparency | Remarks |
| 1 | ITO | A | PH510 | — | 100/0 | 300 nm | D | Comp. |
| 2 | ITO | B | PH510 | P-1 | 30/70 | 300 nm | A | Inv. |
| 3 | ITO | C | PH510 | P-1 | 50/50 | 300 nm | A | Inv. |
| 4 | ITO | D | PH510 | P-1 | 80/20 | 300 nm | C | Inv. |
| 5 | ITO | E | PH510 | P-2 | 30/70 | 300 nm | A | Inv. |
| 6 | ITO | F | PH510 | P-3 | 30/70 | 300 nm | A | Inv. |
| 7 | ITO | G | PH510 | P-1 + DMSO | 30/70 | 300 nm | A | Inv. |
| 8 | ITO | H | PH510 | Aqueous polyester + DMSO + Block isocyanate crosslinking agent | 30/70 | 300 nm | A | Inv. |
| 9 | ITO | I | PH510 | Polyvinyl alcohol + DMSO + Epoxy based crosslinking agent | 30/70 | 300 nm | B | Inv. |
| 10 | ITO | B | PH510 | P-1 | 30/70 | 300 nm | A | Inv. |
| 11 | ITO | B | PH510 | P-1 | 30/70 | 300 nm | A | Inv. |
| 12 | ITO | B | PH510 | P-1 | 30/70 | 300 nm | A | Inv. |
| 13 | ITO | J | 4083 | — | 100/0 | 300 nm | C | Comp. |
| 14 | ITO | K | 4083 | P-1 | 30/70 | 300 nm | A | Inv. |
| 15 | ITO | K | 4083 | P-1 | 30/70 | 300 nm | A | Inv. |
| 16 | ITO | K | 4083 | P-1 | 30/70 | 300 nm | A | Inv. |
| 17 | Ag nanowire | A | PH510 | — | 100/0 | 300 nm | D | Comp. |
| 18 | Ag nanowire | B | PH510 | P-1 | 30/70 | 300 nm | B | Inv. |
| 19 | Cu mesh | A | PH510 | — | 100/0 | 500 nm | D | Comp. |
| 20 | Cu mesh | B | PH510 | P-1 | 30/70 | 500 nm | B | Inv. |
| 21 | ITO | A | PH510 | — | 100/0 | 100 nm | B | Comp. |
| 22 | ITO | J | 4083 | — | 100/0 | 100 nm | A | Comp. |
| 23 | ITO | L | PH510 | Aqueous polyester + DMSO | 30/70 | 300 nm | A | Comp. |
| 24 | ITO | M | PH510 | P-4 | 30/70 | 300 nm | A | Inv. |
| 25 | ITO | — | — | — | — | — | A | Comp. |

Comp.: Comparative example,
Inv.: Present invention
P-1: poly (2-hydroxyethyl acrylate)
P-2: poly (2-hydroxyethylvinyl ether)
P-3: poly (2-hydroxyethylacrylamide)
P-4: poly (2-hydroxyethyl acrylate/2-hydroxyethylvinyl ether)
PH 510: PEDOT-PSS CLEVIOS PH 510
4083: PEDOT-PSS CLEVIOS P AI 4083

As is clear from Table 1, in the case of the conductive polymer singly, since influence of foreign matter and impurities is reduced, it is to be understood that the transmittance is largely reduced when increasing the film thickness.

[Washing]

A substrate fitted with each of ITO electrodes 2-9, 11-12, 14-16 and 24; Ag nanowire electrode 18; and Cu mesh electrode 20 was subjected to washing with ultrapure water. As the washing liquid, used was ultrapure water prepared by a Milli-Q water preparation apparatus Milli-Q Advantage (manufactured by Nihon Millipore KK). Each substrate was immersed in a washing container employing a roll-to-roll system, and was transferred at a speed of 1 m/h. An amount of washing water was set to 1 l/h to conduct washing in a single container. Further, after washing, the electrode was dried at 150° C. for 20 minutes. ITO electrode 10 was not subjected to washing, and difference in performance was checked in comparison to ITO electrode 2 via presence or absence of application of washing.

Further, since an electrode in which a layer of PEDOT only is formed as a transparent conductive layer (each of ITO electrodes 1, 13 and 23; Ag nanowire electrode 17; and Cu mesh electrode 19) has no crosslinking structure, no washing was carried out because of appearance of a film surface being roughened via washing.

[Preparation of Organic EL Device]

Organic EL elements each were prepared by using each electrode as described below. A part of each of the resulting electrodes 1-10, 13, 14, and 17-24 was cut into a square, 5 cm on a side, and PEDOT/PSS 4083 (produced by H. C. Starck GmbH) was coated by a spin coater to form a conductive layer having a thickness of 30 nm, which was placed as a hole injection layer. As to ITO electrodes 11 and 15, PEDOT/PSS PH 510 (produced by H. C. Starck GmbH) was formed as a hole injection layer having a thickness of 30 nm by the same method. Further, as to ITO electrodes 12 and 16, NAFION prepared by a method described below was formed as a hole injection layer having a thickness of 30 nm.

Next, an appropriate amount of a constituent material in each layer for preparation of a device was filled in each crucible for evaporation, placed in a commercially available vacuum evaporator. Those made of tungsten as a resistance-heating material were used for the crucible for evaporation.

After reducing pressure to a vacuum degree of $1 \times 10^{-4}$ Pain advance, a crucible for evaporation were α-NPD was placed was heated via electricity application, and evaporation was conducted on an anode electrode at an evaporation speed of 0.1 nm/sec to form a 30 nm thick hole transport layer.

Next, each emission layer was formed by the following procedures.

Ir-1, Ir-2 and compound I-1 were co-evaporated at an evaporation speed of 0.1 nm/sec so as to reach an Ir-1 content of 13% by weight and an Ir-2 content of 3.7% by weight to form a greenish red phosphorescence emission layer having an emission maximum wavelength of 622 nm and a thickness of 10 nm.

Next, E-1 and compound I-1 were co-evaporated at an evaporation speed of 0.1 nm/sec so as to reach an E-1 content of 10% by weight to form a blue phosphorescence emission layer having an emission maximum wavelength of 471 nm and a thickness of 15 nm.

M-1 was evaporated so as to give a film thickness of 5 nm to form a hole blocking layer, and CsF together with M-1 was further co-evaporated so as to give a film thickness ratio of 10% to form an electron transport layer having a thickness of 45 nm.

Further, aluminum was evaporated so as to give a thickness of 110 nm to form a cathode.

Next, used was a flexible sealing member in which $Al_2O_3$ was evaporated on a polyethylene terephthalate substrate so as to give a thickness of 300 μm. The end portions were eliminated in such a way that externally connecting terminals of an anode electrode and a cathode electrode could be formed, and after an adhesive was coated around the cathode electrode, the flexible sealing member was attached thereon, Thereafter, the adhesive was cured via a heat-treatment to prepare organic EL devices 1-24 with respect to the electrodes, respectively.

In addition, no transparent conductive layer was formed on an ITO electrode, but PEDOT-PSS 4083 was used for an injection layer to prepare organic EL device 25 as a comparative sample.

Materials used for the first transparent electrode, the transparent conductive layer and the hole injection layer in each of organic EL devices were collectively shown in Table 1. Further, materials used for formation of organic EL layers are shown below.

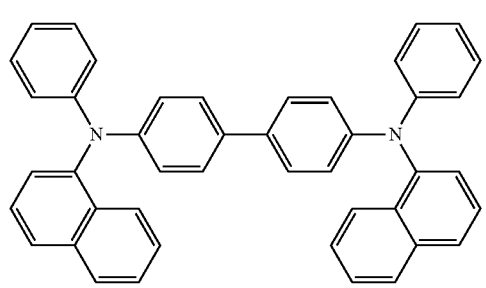

α-NPD

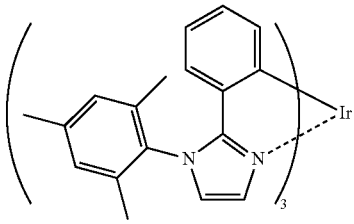

E-1

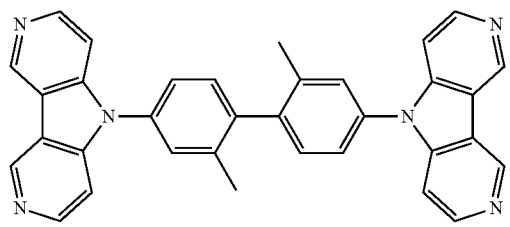

M-1

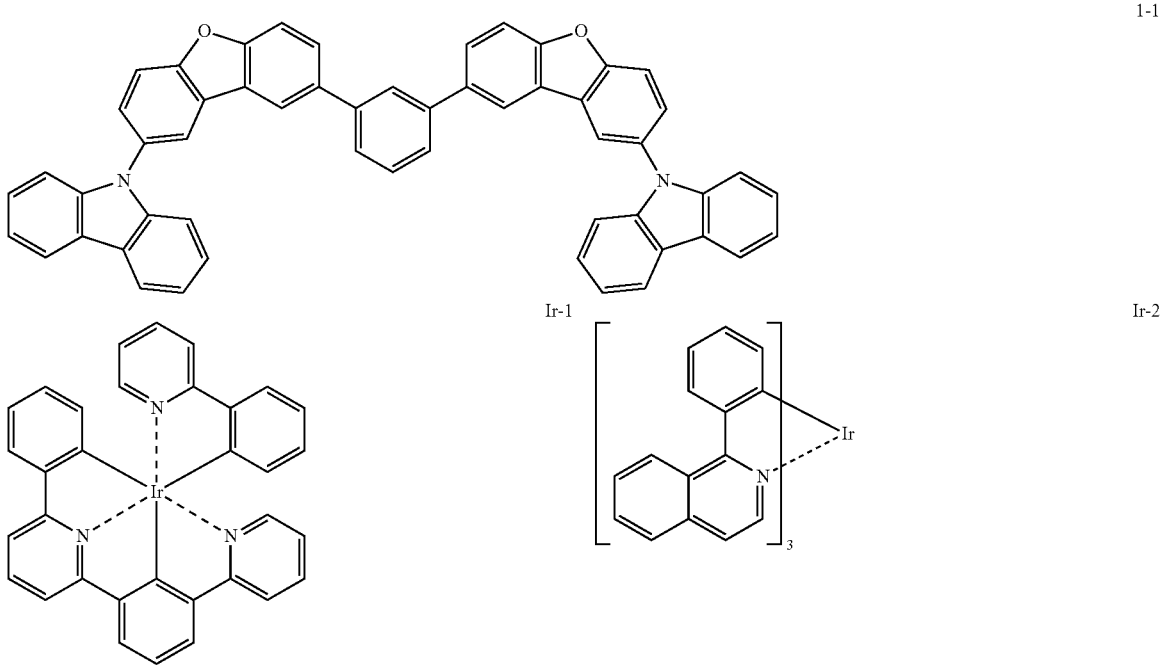

[NAFION (Produced by Dupont)]

Into 500 ml flask, charged were 142.68 g (16.03 mmol of a NAFION (Registered Trademark) monomer unit) of SE-10072 and 173.45 g of deionized water.

Employing deionized water, 0.07 g of ferric sulfate hydrate were dissolved in 12.28 g of a total finishing amount to prepare a ferric sulfate solution. Next, 1.40 g of the ferric sulfate solution and 1.72 g (7.224 mmol) of sodium persulfate were added in a flask, followed by sufficiently stirring. Contents in the flask were charged in a 500 ml three-necked flask. Next, the mixture was stirred in a reaction vessel for 30 minutes. Into the reaction mixture, added were 0.63 ml (5.911 mmol) of 3,4-ethylenedioxythiophene while stirring. Polymerization was performed at roughly 23° C. while stirring. After one hour seven minutes, polymerized liquid turned very rich blue.

Into aqueous PEDOT/NAFION (Registered Trademark) polymerization liquid, added were 5.0 g of an anionic ion exchanger (Bayer AG; Lewatit MP62) and 5.0 g of a cationic ion exchanger (Bayer AG; Lewatit 5100), followed by stirring for 8 hours. The Ion exchangers were removed therefrom via filtration.

A 10 g PEDOT/NAFION (Registered Trademark) dispersion of a solid content of 1.89% by weight based on mass spectrometry for dried solid was prepared.

[Evaluation of Organic EL Device]

The following evaluations were made for organic devices 1-25, and collectively shown in Table 2.

(Driving Voltage)

As to the resulting organic EL devices 1-24, the voltage during emission at 5000 cd/m$^2$ as an initial luminance is designated as a driving voltage, and ratios thereof with respect to organic EL device 25 were determined to be evaluated by the following indicator levels. At least 3 is preferable, but at least 4 is more preferable.

5: Less than 90%
4: At least 90% and less than 95%
3: At least 95% and less than 100%
2: At least 100% and less than 110%
1: At least 110%

(Lifetime)

Time that elapsed before luminance fell to one-half was determined by continuously emitting each of the resulting organic EL devices 1-25 at 5000 cd/m$^2$ as an initial luminance. Ratios thereof with respect to organic EL device 25 were determined, and evaluations were made as lifetime by the following indicator levels and shown in Table 2. At least 2 is preferable, but at least 3 is more preferable.

5: At least 200%
4: At least 150% and less than 200%
3: At least 120% and less than 150%
2: At least 110% and less than 120%
1: At least 100% and less than 110%
0: Less than 100%

(Storing Property)

A device was arbitrarily selected, and stored in a thermostat at 80° C. It was removed from the thermostat every 12 hours, and voltage during emission at initial 1000 cd/m$^2$ was applied thereto. Luminance at this time was measured, and time that elapsed before the luminance fell to one-half was evaluated as storing time. Ratios thereof with respect to organic EL device 25 were determined, and evaluations were made by the following indicator levels. At least 2 is preferable, but at least 3 is more preferable.

5: At least 200%
4: At least 150% and less than 200%
3: At least 120% and less than 150%
2: At least 110% and less than 120%
1: At least 100% and less than 110%
0: Less than 100%

Evaluated results are shown in Table 2.

TABLE 2

| Organic electronic device No. | Electrode No. | Washing | Hole injection layer | Driving voltage | Life-time | Storing property | Remarks |
|---|---|---|---|---|---|---|---|
| 1 | 1 | Not conducted | 4083 | 3 | 1 | 2 | Comp. |
| 2 | 2 | Conducted | 4083 | 4 | 4 | 4 | Inv. |
| 3 | 3 | Conducted | 4083 | 4 | 4 | 4 | Inv. |
| 4 | 4 | Conducted | 4083 | 4 | 4 | 4 | Inv. |
| 5 | 5 | Conducted | 4083 | 4 | 4 | 4 | Inv. |
| 6 | 6 | Conducted | 4083 | 4 | 4 | 4 | Inv. |
| 7 | 7 | Conducted | 4083 | 4 | 4 | 4 | Inv. |
| 8 | 8 | Conducted | 4083 | 3 | 3 | 4 | Inv. |
| 9 | 9 | Conducted | 4083 | 3 | 3 | 4 | Inv. |
| 10 | 10 | Not conducted | 4083 | 3 | 2 | 3 | Inv. |
| 11 | 11 | Conducted | PH510 | 4 | 4 | 4 | Inv. |
| 12 | 12 | Conducted | Nafion | 5 | 5 | 5 | Inv. |
| 13 | 13 | Not conducted | 4083 | 3 | 1 | 2 | Comp. |
| 14 | 14 | Conducted | 4083 | 4 | 4 | 4 | Inv. |
| 15 | 15 | Conducted | PH510 | 4 | 4 | 4 | Inv. |
| 16 | 16 | Conducted | Nafion | 5 | 5 | 5 | Inv. |
| 17 | 17 | Not conducted | 4083 | 3 | 0 | 1 | Comp. |
| 18 | 18 | Conducted | 4083 | 4 | 4 | 4 | Inv. |
| 19 | 19 | Not conducted | 4083 | 3 | 0 | 1 | Comp. |
| 20 | 20 | Conducted | 4083 | 4 | 3 | 3 | Inv. |
| 21 | 21 | Not conducted | 4083 | 2 | 1 | 1 | Comp. |
| 22 | 22 | Not conducted | 4083 | 3 | 1 | 2 | Comp. |
| 23 | 23 | Not conducted | 4083 | 2 | 0 | 1 | Comp. |
| 24 | 24 | Conducted | 4083 | 4 | 4 | 4 | Inv. |

Comp.: Comparative example,
Inv.: Present invention

As is clear from Table 2, it is to be understood that each of organic EL devices of the present invention exhibits largely excellent lifetime and storing property at low driving voltage. Specifically, it is confirmed that NAFION having a small work function is preferably used as a hole injection layer (organic EL devices 12 and 16). It is also understood that washing is effective (organic EL device 2 and organic EL device 10, and organic EL device 8 and organic EL device 23). Further, it is understood that as to those each in which a conductive polymer is used singly, transparency can be improved by making the film thickness to be thin, but the driving voltage, the lifetime and the storing property are degraded together (organic EL devices 1 and 13, and organic EL devices 21 and 22).

Further, when an organic solar cell device possessing a transparent conductive film of the present invention was prepared and evaluated, it was similarly confirmed that lifetime and storing property were improved.

It was to be understood that an organic electronic device possessing a transparent conductive film of the present invention, provided on a polyimide film as a support substrate in place of support substrate 1, which had been subjected to a heat treatment at 200° C. for 20 minutes, and another organic electronic device possessing a transparent conductive film of the present invention, provided on a glass substrate as a support substrate in place of support substrate 1, which had been subjected to a heat treatment at 250° C. for 20 minutes exhibited superior properties to those of an organic electronic device as a comparative example in which an electrode was formed on a polyimide film, and another organic electronic device as a comparative example in which an electrode was formed on a glass substrate.

The invention claimed is:

1. An organic electronic device comprising a transparent substrate and provided thereon, a first transparent electrode, a second electrode and an organic functional layer provided between the first transparent electrode and the second electrode, wherein the first transparent electrode and the second electrode are opposed to each other, a transparent conductive layer is provided between the first transparent electrode and the organic functional layer, and the transparent conductive layer comprises 100 parts by weight of a conductive polymer and 100 to 900 parts by weight of an aqueous binder, and wherein the aqueous binder comprises Polymer (A) containing at least one selected from the monomer units represented by the following $(A_1)$, $(A_2)$ and $(A_3)$:

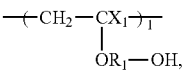

$(A_1)$

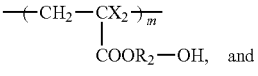

$(A_2)$

$(A_3)$ where $X_2$, $X_2$ and $X_3$ each independently represent a hydrogen atom or a methyl group; $R_1$, $R_2$ and $R_3$ each independently represent an alkylene group having 5 carbon atoms or less; and "l", "m" and "n" each represent a component ratio of mol/%, satisfying $50 \leq l+m+n \leq 100$.

2. The organic electronic device of claim 1, wherein in the transparent conductive layer, at least a part of the conductive polymer or the aqueous binder is crosslinked.

3. The organic electronic device of claim 1,
wherein the conductive polymer comprises a conductive polymer containing a p conjugated conductive polymer component and a polyanionic component.

4. The organic electronic device of claim 3,
wherein the polyanionic component comprises a polysulfonic acid group.

5. The organic electronic device of claim 1,
wherein the transparent conductive layer has been subjected to wet washing.

6. The organic electronic device of claim 1,
wherein the organic functional layer adjacent to the transparent conductive layer comprises a hole injection layer.

7. The organic electronic device of claim 6,
wherein the hole injection layer comprises a polyanion containing fluorine (F).

8. A method of manufacturing the organic electronic device of claim 1, comprising the step of:
conducting a heat treatment at a temperature of 100-250° C. for 5 minutes or more after coating and drying of the transparent conductive layer comprising the conductive polymer and the aqueous binder.

9. The organic electronic device of claim 1, wherein the transparent conductive layer has a dry film thickness of not less than 200 nm and not more than 1000 nm.

10. The organic electronic device of claim 1, wherein, in the transparent conductive layer, the aqueous binder is cross-linked to the conductive polymer.

\* \* \* \* \*